United States Patent [19]
Smith

[11] Patent Number: 5,251,120
[45] Date of Patent: Oct. 5, 1993

[54] HARMONIC NOISE ISOLATION AND POWER FACTOR CORRECTION NETWORK

[76] Inventor: Steve Smith, 5100 Channel Ave., Richmond, Calif. 94804

[21] Appl. No.: 817,927

[22] Filed: Jan. 2, 1992

Related U.S. Application Data

[63] Continuation-in-part of Ser. No. 888,137, Jul. 23, 1986, Pat. No. 5,113,335.

[51] Int. Cl.⁵ .............................................. H02M 1/12
[52] U.S. Cl. .................................... 363/44; 363/126
[58] Field of Search .................................... 363/39, 44–48, 363/126; 333/175, 176, 167, 81

[56] References Cited

U.S. PATENT DOCUMENTS

| | | | |
|---|---|---|---|
| 3,133,259 | 5/1964 | Van Dine | 363/44 |
| 4,672,522 | 1/1987 | Lesea | 363/48 |
| 5,113,335 | 5/1992 | Smith | 363/44 |
| 5,148,359 | 9/1992 | Nguyen | 363/48 |

FOREIGN PATENT DOCUMENTS

| | | |
|---|---|---|
| 258576 | 3/1988 | European Pat. Off. . |
| 1927415 | 1/1970 | Fed. Rep. of Germany . |
| 3012747 | 10/1981 | Fed. Rep. of Germany ........ 363/44 |
| 157261 | 12/1981 | Japan ..................................... 363/44 |

Primary Examiner—William H. Beha, Jr.
Attorney, Agent, or Firm—Thomas E. Schatzel

[57] ABSTRACT

A network for connection between an AC power line and a DC power supply to isolate harmonic currents generated by the DC power supply from the AC power supply, the network employing at least one "resonator", which is connected across the input of a DC power supply, and at least one "reflector", which is connected to couple the input of the DC power supply to an AC power line. Each "resonator," includes the series combination of an inductor and a capacitor. At least some of the "reflectors" include the parallel combination of an inductor and a capacitor.

13 Claims, 2 Drawing Sheets

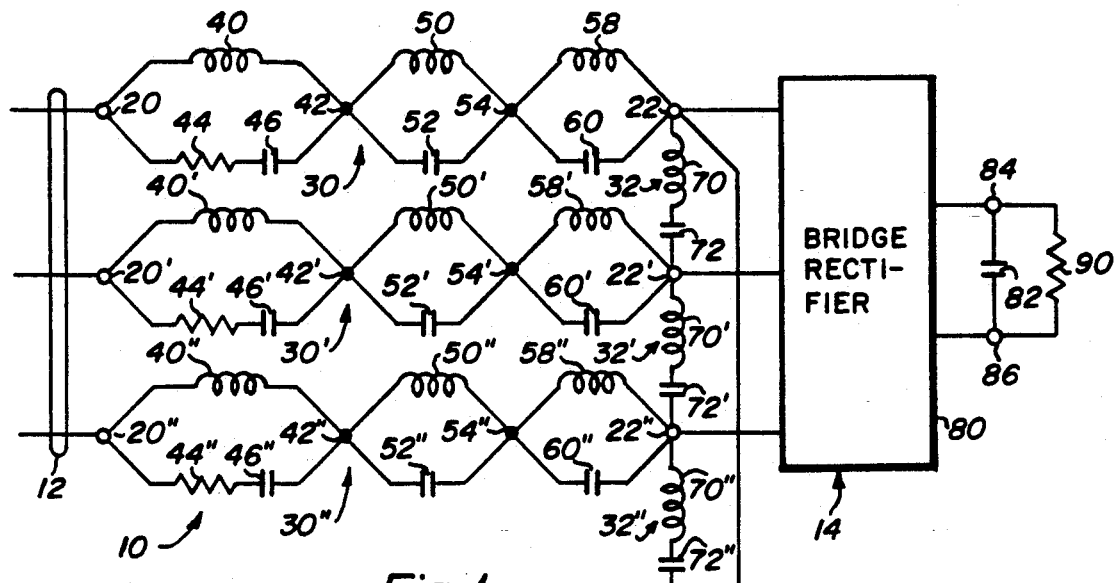
Fig_1
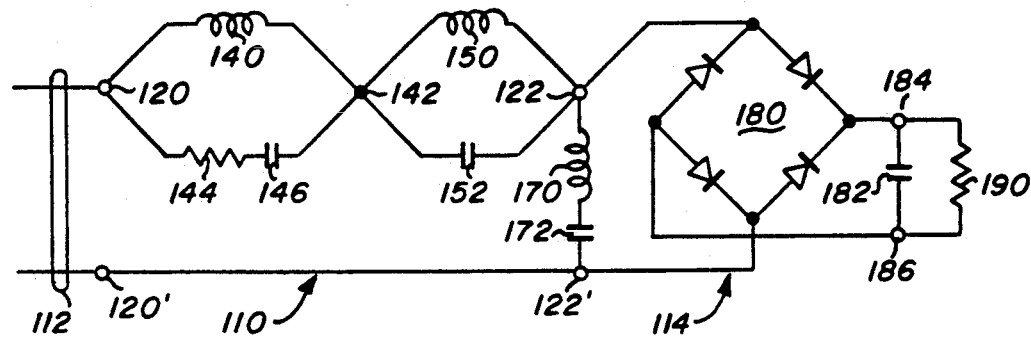
Fig_2
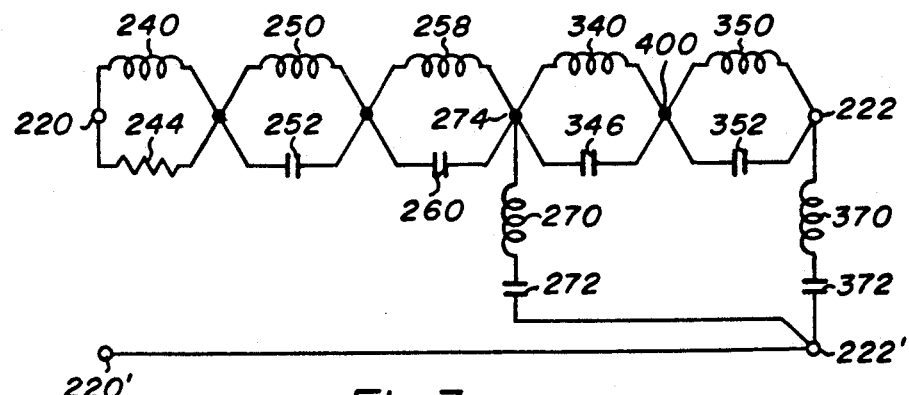
Fig_3

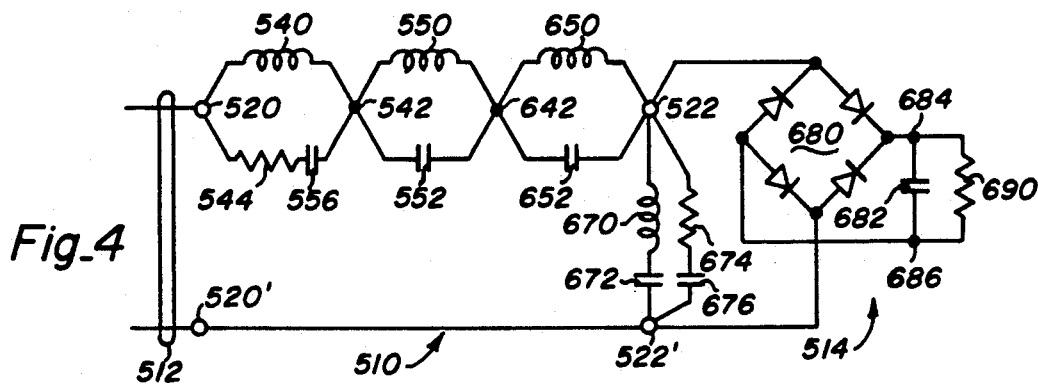
Fig_4
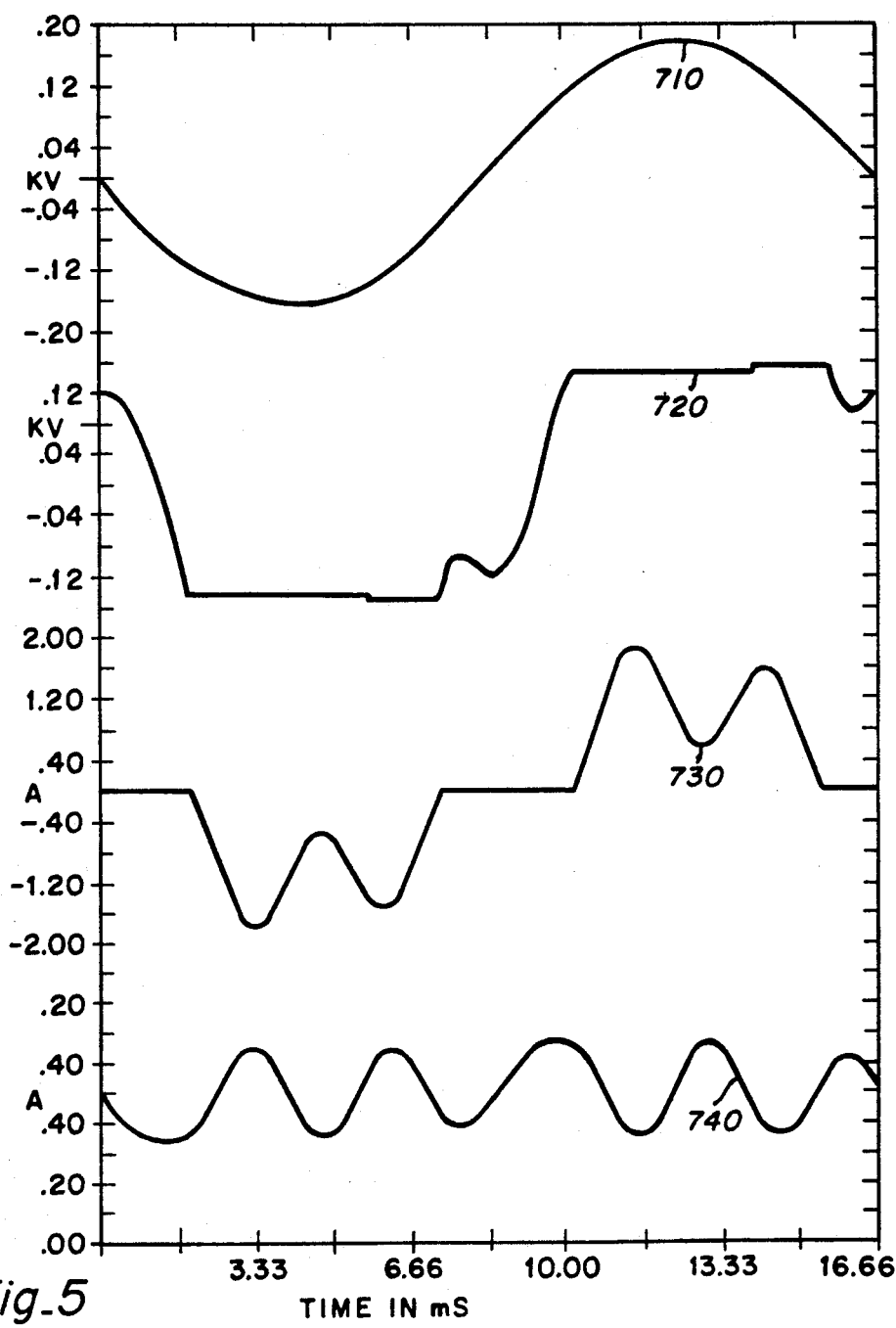
Fig_5

HARMONIC NOISE ISOLATION AND POWER FACTOR CORRECTION NETWORK

CROSS REFERENCE TO RELATED APPLICATIONS

This patent application is a continuation-in-part of the U.S. patent application Ser. No. 06/888,137, which was filed on Jul. 23, 1986, now U.S. Pat. No. 5,113,535.

BACKGROUND OF THE INVENTION

1. Field of the Invention

The present invention relates to the power factor which loads present to AC power lines generally and more specifically to the reduction of the harmonic currents generated on an AC power line by a DC power supply.

2. Description of the Prior Art

The power factor that a load presents to an AC power line has long been of concern. At one time, the primary concern was the inductive component of some loads. Consider, for example, the section taken from the text entitled *American Electricians' Handbook* (8th ed. 1961) which was edited by Terrell Croft, revised by Clifford C. Carr, and published by McGraw Hill Inc.

"143. Correction of Low Power Factor. In industrial plants, excessively low power factor is usually due to underloaded induction motors because the power factor of motors is much less at partial loads than at full load. Where motors are underloaded new motors of small capacity should be substituted. Power factor can be corrected (1) by installing synchronous motors (2) by connecting static capacitors across the line." (end of section)

Of late, the "power factor" presented by DC power supplies has become a concern. Typically, DC power supplies employ a bridge rectifier, a filter capacitor, and, sometimes, a filter choke. The input of the rectifier is coupled (by a fuse, switch, etc.) across an AC power line. The output of the rectifier is either coupled by the choke across the capacitor (choke input filter) or, absent the choke, directly connected across the capacitor (capacitor-input filter) to develop a DC (output) potential across the capacitor.

With the choke (input filter), DC power supplies draw from the AC power line a current the waveform of which approximates a square wave (when the inductance of the choke is much greater than what is commonly referred to as the "critical" inductance). Absent the choke, the waveform more approximates a series of pulses each of which is synchronized with a corresponding peak of the AC power-line potential. In either case, the current drawn from the AC power line includes harmonic components (currents), one for each of the odd harmonics of the AC power-line frequency.

The level of the harmonic currents generated on both a three-phase and a single-phase AC power power line by both a choke-input and a capacitor-input, full-wave, DC power supply were calculated. The DC power supply was directly connected to the AC power line; and, a load resistor was directly connected across the DC power supply filter capacitor. (Small resistors were included in series with various components to facilitate the calculations.) The calculations were performed by a computer program entitled Micro-Cap II by Spectrum Software. An rms AC power line potential of 120 volts was used.

| Harmonic currents generated on an three-phase AC power line by a choke-input, full-wave, DC power supply | |
|---|---|
| | level of the harmonic currents relative the fundamental |
| 1st | 100.0% |
| 2nd | 0.0% |
| 3rd | 0.2% |
| 4th | 0.0% |
| 5th | 19.8% |
| 6th | 0.0% |
| 7th | 14.4% |
| 8th | 0.0% |
| 9th | 0.2% |
| 10th | 0.0% |
| 11th | 8.9% |
| 12th | 0.0% |
| 13th | 7.8% |
| 14th | 0.0% |
| 15th | 0.2% |
| 16th | 0.0% |
| 17th | 5.7% |
| 18th | 0.0% |
| 19th | 5.3% |
| 20th | 0.0% |
| 21st | 0.3% |
| 22nd | 0.0% |
| 23rd | 4.2% |
| 24th | 0.0% |
| 25th | 4.1% |
| 26th | 0.0% |
| 27th | 0.3% |
| 28th | 0.0% |
| 29th | 3.3% |

| Load | Power | Frequency | Output | Total Harmonic Level |
|---|---|---|---|---|
| 2000 Watt | 2000 W | 60 Hz | 158 V DC | 30.0% |

| Harmonic currents generated on an three-phase AC power line by a capacitor-input, full-wave, DC power supply | |
|---|---|
| | level of the harmonic currents relative the fundamental |
| 1st | 100.0% |
| 2nd | 0.0% |
| 3rd | 0.1% |
| 4th | 0.0% |
| 5th | 62.7% |
| 6th | 0.0% |
| 7th | 36.0% |
| 8th | 0.0% |
| 9th | 0.0% |
| 10th | 0.0% |
| 11th | 3.7% |
| 12th | 0.0% |
| 13th | 8.6% |
| 14th | 0.0% |
| 15th | 0.1% |
| 16th | 0.0% |
| 17th | 2.9% |
| 18th | 0.0% |
| 19th | 1.9% |
| 20th | 0.0% |
| 21st | 0.0% |
| 22nd | 0.0% |
| 23rd | 2.8% |
| 24th | 0.0% |
| 25th | 0.7% |
| 26th | 0.0% |
| 27th | 0.0% |
| 28th | 0.0% |
| 29th | 2.0% |

Total Harmonic

-continued

| Load | Power | Frequency | Output | Level |
|---|---|---|---|---|
| 2000 Watt | 2000 W | 60 Hz | 153 V DC | 73.1% |

| Harmonic currents generated on a single-phase AC power line by a capacitor-input, full-wave, DC power supply | |
|---|---|
| | level of the harmonic currents relative the fundamental |
| 1st | 100.0% |
| 2nd | 0.0% |
| 3rd | 94.9% |
| 4th | 0.0% |
| 5th | 85.2% |
| 6th | 0.0% |
| 7th | 72.1% |
| 8th | 0.0% |
| 9th | 56.9% |
| 10th | 0.0% |
| 11th | 41.3% |
| 12th | 0.0% |
| 13th | 26.8% |
| 14th | 0.0% |
| 15th | 15.2% |
| 16th | 0.0% |
| 17th | 8.7% |
| 18th | 0.0% |
| 19th | 8.7% |
| 20th | 0.0% |
| 21st | 10.1% |
| 22nd | 0.0% |
| 23rd | 10.0% |
| 24th | 0.0% |
| 25th | 8.3% |
| 26th | 0.0% |
| 27th | 5.7% |
| 28th | 0.0% |
| 29th | 3.4% |
| 30th | 0.0% |
| 31st | 3.0% |
| 32nd | 0.0% |
| 33rd | 3.7% |
| 34th | 0.0% |
| 35th | 4.1% |
| 36th | 0.0% |
| 37th | 3.8% |
| 38th | 0.0% |
| 39th | 2.8% |
| 40th | 0.0% |
| 41st | 1.7% |
| 42nd | 0.0% |
| 43rd | 1.3% |
| 44th | 0.0% |
| 45th | 1.7% |
| 46th | 0.0% |
| 47th | 2.0% |
| 48th | 0.0% |
| 49th | 2.0% |
| 50th | 0.0% |

| Power Factor |
|---|
| 0.42 |

| Load | Power | Frequency | Output | Total Harmonic Level |
|---|---|---|---|---|
| 200 Ohms | 131 W | 60 Hz | 162 V DC | 167% |

It is important to note that a DC power supply employing a full wave rectifier (such as a bridge rectifier) (with properly balanced transformer, if employed, and rectifier diodes) generates harmonic currents only at the ODD harmonics of the AC power line frequency. (See, for example, the fifth, 1968, edition of Howard W. Sams & Co., Inc. (ITT) *Reference Data For Radio Engineers* section 42-8 "Odd or Even Harmonics," where it is stated that:

"(a) condition that causes a function f(x) of period 2(pi) to have only odd harmonics in its Fourier expansion is f(x)= −f(x+pi)."

(Even if the transformer, if employed, and the rectifier diodes are not properly balanced, the level of the currents at even harmonics of the AC power line frequency will, normally, be negligible.)

DC power supplies do not conform to all of the old power factor conventions. (For example, it makes little sense to define the power factor a DC power supply presents to an AC power line as the cosine of the phase angle between the voltage developed across the input of the DC power supply and the current flowing into it.) However, they (DC power supplies) do present many of the same problems. DC power supplies, like other loads having a relatively low power factor, draw from the AC power line a current the rms level of which is disproportionately high in relation to the current that should be drawn for the power consumed. (In other words, they do conform to the definition which states that the power factor of a load (in this case, a DC power supply) is given by the ratio of the actual power consumed (in this case by a load connected to the output of the DC power supply) (as indicated by a wattmeter) to the apparent power (as indicated by the combination of a (true rms, iron-vane or thermocouple-type) ammeter and a voltmeter) (connected to the input of the DC power supply).

A relatively high AC power-line rms current is of concern in that the AC power-generating facilities and AC power-transmission facilities (lines and transformers) must be sized to accommodate the current. Further, generation and transmission losses are primarily resistive losses which, therefore, increase as the square of the level of the rms AC power-line current. It is important to note that even relatively small loads (DC power supplies) may be of concern. Although a small personal computer, for example, may not draw the level of the current drawn by a large smoke stack scrubber, if the DC power supply of the computer has a relatively low power factor, the current drawn by the DC power supply may be of such a level as to limit what may also be plugged into a single AC power-line wall outlet.

In addition, DC power supplies present many special problems, particularly for the military. As the number of airborne and shipborne systems employing DC power supplies has increased, so has the level of harmonic currents generated on the various AC power lines. With the increased levels of harmonic currents has come an increase in the above mentioned generation and transmission problems. In addition, and of potentially much more serious consequence, the high levels of harmonic currents are causing problems of undesired system interaction. As a consequence, standards have been promulgated including those in the Department of Defense document which is identified as DOD-STD-1399(NAVY) SECTION 300 1 AUG. 1978 and which is entitled *MILITARY STANDARD INTERFACE STANDARD FOR SHIPBOARD SYSTEMS SECTION 300 ELECTRIC POWER, ALTERNATINC CURRENT.* Of particular relevance is the following section.

"6.2.7 Harmonic current. The operation of equipment shall be designed to have minimum harmonic distortion effect on the electrical system. The operation of such equipment with the following specified ratings shall not cause harmonic line currents to be generated that are greater than 3 percent of the unit's full load fundamental current between the 2nd and 32nd harmonic. . . ."

(For a power-source frequency of 60 Hz, a 1 kVA or more unit rating is specified.)

"Additionally, currents with frequencies from the 32nd harmonic through 20 kilohertz (kHz) shall not exceed 100/n percent . . ."

In Table I. (on page 5) the total harmonic distortion is limited to 5 percent; and, in section 6.2.2 the power factor is limited to the range of 0.8 lagging to 0.95 leading. Further, in Table I. (on page 5) the worst case frequency excursion from nominal frequency is listed as 5½ percent.

Heretofore, great difficulty has been had in meeting the above-mentioned standard.

It has been suggested that a filter be used to "trap and shunt undesirable harmonics." To illustrate the the problems associated with the use of a filter to isolate from an AC power line, harmonic currents a DC power supply would, otherwise, generate on the line, performance characteristics were calculated for a circuit in which the above-mentioned (capacitor-input-type) DC power supply was coupled to the line by means of a filter designed to match a zero ohm source (driving) impedance to a 144 ohm load impedance. Specifically, an 8-pole, Butterworth, low pass filter was designed. (First, for low, pass band attenuation, 60 Hz was set equal to 0.7 omega, making omega equaled to 86 Hz. Next, it was noted that when the above-mentioned (capacitor-input-type) DC power supply was directly connected to the AC power line, the third harmonic level was approximately 94%. Also, it was noted that the above-mentioned military specification required that the third harmonic level not exceed 3%. Thus, an 8-pole filter (n equal 8) was chosen to provide an approximate 30:1 voltage reduction (approximately 50 dB) at 180 Hz (2.1 omega). Also chosen was a d of 0.02. As a consequence for the 8-pole, Butterworth, low pass filter:

| L(1) = 1.398 | C(2) = 1.963 |
| L(3) = 1.648 | C(4) = 1.602 |
| L(5) = 1.243 | C(6) = 0.9613 |
| L(7) = 0.5829 | C(8) = 0.1982. |

(Where L(1) is connected in series with the AC power line; and, C(8) is connected across the input of the DC power supply.) These component values were scaling for omega equal to two pi times 86 Hz. and Z(0) equal to 144 ohms. (L' equals 144 divided by the quantity of two pi times 86 Hz.; and, C' equals one divided by the quantity 144 times two pi times 86 Hz.) (See, for example, pages 7, 8, and 136 of the first edition (1963) of the book by Philip R. Geffe which is entitled *Simplified Modern Filter Design.*) As a consequence:

| L(1) = *0.3726 H* | C(2) = 25.23 mfd |
| L(3) = 0.4392 H | C(4) = 20.59 mfd |
| L(5) = 0.3312 H | C(6) = 12.35 mfd |
| L(7) = 0.1553 H | C(8) = 2.547 mfd. |

Harmonic currents generated on an AC power line by a DC power supply coupled to the line by the 8-pole, Butterworth, low pass filter

| | level of the harmonic currents relative the fundamental |
|---|---|
| 1st | 100.00% |
| 2nd | 0.22% |
| 3rd | 0.08% |
| 4th | 0.08% |
| 5th | 0.07% |
| 6th | 0.06% |
| 7th | 0.06% |
| 8th | 0.06% |
| 9th | 0.05% |

| Load | Power | Frequency | Output | Total Harmonic Level |
|---|---|---|---|---|
| 200 Ohms | 50 W | 60 Hz | 100 V DC | 0.4% |

It is important to note the relatively low potential (100 volts) which was developed across the load, as compared to the 162 volt DC potential which was developed by the DC power supply across the 200 ohm (131 watt) load without the filter. In addition, the circuit exhibited a number of other, undesirable, characteristics. Noted was a 15 ms delay, a 32 ms overshoot, a resonant boost, a current lag, and an impulse in the output following the start impulse. Further, the phase angle of the fundamental would suggest a power factor of 0.66. Finally, it is important to note the size of the components.

The use of series-connected, parallel-resonant, inductor-capacitor-type "LC filters" is shown in three prior-art patents. The German patent DE 3012-747 of Wilhelm Kleische shows (in the sole figure) what is referred to (in the Abstract) as an "LC filter circuit". The "LC filter circuit" includes the parallel combination of an inductor (L) and a capacitor (C). The "LC filter circuit" is shown connected in series with the primary of a transformer (T) across an incoming main (an AC power line?). The secondary of the transformer (T) is shown connected across the input of a bridge rectifier of a (capacitor-input-type) DC power supply (C and Co). It is indicated that.

"(t)he resonant frequency of the LC circuit is chosen to reduce overvoltage peaks and improve the current phase angle. Usually the frequency is the fifth but maybe the ninth or thirteenth harmonic of the mains frequency."

The Japanese patent 58[1983]-163271 of Kawaguchi Yuuji et al shows (in FIG. 1) what is referred to (in the Abstract) as a "filter circuit" (7). The "filter circuit" includes the parallel combination of an inductor (2) and a capacitor (3). The "filter circuit" (7) is shown connected to couple the input of a (capacitor-input-type) DC power supply (of an "inverter unit") (8) to a "commercial power supply" (AC power line?) (1). It is indicated (in the Abstract) that the "filter circuit" is "(t)o reduce the third and fifth harmonic waves due to capacitor charge improving power factor . . .."

Further, it is indicated (in the body of the patent) that the "filter circuit" is resonant at the third harmonic.

The Q was not specified. Finally, it is indicated (in the body of the patent) that "the power factor can be improved by a large margin to 90%, as compared to 64% when the filter of this invention is not inserted."

The Japanese patent 56[1981]-157261 of Kouichi Noguchi shows (in FIG. 3) what is referred to (in the Abstract) as an "overcurrent limiting capacitor" (10) and three "parallel resonant circuits" (16, 17, and 20). Each "parallel resonant circuit" includes the parallel combination of an inductor and a capacitor (the inductor of "circuit" 16 being designated 15 and the capacitor of the "circuit" being designated 14). The "overcurrent limiting capacitor" (10) and the three "parallel resonant circuits" (16, 17, and 20) are shown connected in series to couple the input of a (capacitor-input-type) DC power supply (which includes components 12, 11, and 13) to an "AC power source (9). As to the resonant frequency of the "circuits", it is indicated that "harmonic components generated due to the distortion of the waveform at the time of charging voltage rise are suppressed by the circuits 16-20 set to have high impedance against the frequency. When the interval of the resonance frequency of the resonance circuit is set as narrow as possible to increase the frequency, its effect can be increased."

To illustrate the operation of series-connected, parallel-resonant "LC filters" of the type shown in the three, above-mentioned, prior-art patents, performance characteristics were calculated for a number of circuits. First, the performance characteristics were calculated for a circuit in which a (capacitor-input-type) DC power supply was directly connected (zero (0) "LC-filters") to an AC power line, as was previously discussed. Then, the performance characteristics were calculated for a circuit in which the DC power supply was coupled to the AC power line by means of a number of (series-connected, parallel-resonant) "LC filters." Calculations were performed for a circuit in which the DC power supply was coupled to the AC power line by means of one (1) (parallel-resonant) "LC filter", resonant at the third harmonic of the AC power line frequency. Next, calculations were performed for a circuit in which the DC power supply was coupled to the AC power line by means of two (2) (series-connected, parallel-resonant) "LC filters", resonant at the third and fifth harmonics of the AC power line frequency. Then, three (3) "LC filters" were used, resonant at the third, fifth, and seventh harmonics; four (4) "LC filters" were used, resonant at the third, fifth, seventh, and ninth harmonics; five (5) "LC filters" were used, resonant at the third, fifth, seventh, ninth, and eleventh harmonics; and, six (6) "LC filters" were used, resonant at the third, fifth, seventh, ninth, eleventh, and thirteenth harmonics. The "LC filters" had a Q of ½, as employed (below) in the present invention. Again, small resistors were included in series with various components to facilitate the calculations. A constant, 100 watt load was used, for reasons which will become apparent shortly. For the six (6) "LC filter" circuit, performance characteristics were calculated at various AC power line frequencies. At a frequency of 57 Hz, the DC potential developed across the load collapsed.

| Harmonic currents generated on an AC power line by a DC power supply coupled to the line by a number of series-connected, parallel-resonant "LC filters" | | | | |
|---|---|---|---|---|
| Number of "LC filters" | Power | Frequency | Output Voltage | Distortion |
| 0 | 131 W | 60 Hz | 162 V DC | 157% |
| 1 | 100 W | 60 Hz | 137 V DC | 32% |
| 2 | 100 W | 60 Hz | 130 V DC | 15% |
| 3 | 100 W | 60 Hz | 127 V DC | 9% |
| 4 | 100 W | 60 Hz | 121 V DC | 6% |
| 5 | 100 W | 60 Hz | 113 V DC | 4.4% |
| 6 | 100 W | 60 Hz | 102 V DC | 3.1% |
| 6 | 100 W | 57 Hz | * | * |
| 6 | 100 W | 59 Hz | 99 V DC | 3.3% |
| 6 | 100 W | 61 Hz | 107 V DC | 3.8% |
| 6 | 100 W | 62 Hz | 112 V DC | 5.8% |
| 6 | 100 W | 63 Hz | 119 V DC | 9.3% |

It is important to note the relatively low DC potential which was developed across the load, as compared to the 162 volt DC potential which was developed by the DC power supply across the load without the "LC filters". Also, it is important to note the sensitivity of the DC load potential to frequency.

The above-mentioned, series-connected, parallel-resonant "LC filters" form a simple series (loop) circuit with the generator of the AC power line and the input (of the bridge rectifier) of the DC power supply. As a consequence, the waveform of the current flowing through the input (of the bridge rectifier) of the DC power supply must be the same as the waveform of the current flowing through the generator of the AC power line. From the sinusoidal voltage waveform developed across the AC power line, the "LC filters" develop across the input (of the bridge rectifier) of the DC power supply a trapezoidal (near square-wave) voltage waveform having a peak level, which is just slightly greater that the level developed at the output of the DC power supply.

Disclosed in the British patent 1,472,411 of T. Kennedy is a filter network which is for use with a load having a non-linear control device (saturable reactor) and which is for absorbing unwanted harmonic currents. The filter network employs a plurality of filters each including an inductor and a capacitor which is connected in series with the (associated) inductor. Each of the filters (inductor-capacitor combinations) is connected in parallel with the load. An additional inductor is employed connected between the AC power line and the load to couple the load to the AC power line. It is indicated (on page 2 in lines 113-115 of the T. Kennedy patent) that each of the filters (inductor-capacitor combinations) is tuned to a frequency less than the harmonic frequency which it is to filter. Further, it is indicated (on page 3 in lines 115-128) that "... the existence of harmonics in the line makes it not only impractical, but also impossible to filter out all of the harmonic current. An attempt to do so may result in overloading the filters. Accordingly, it has been determined that the better approach is to remove only a percentage of the harmonic currents generated as a result of the load and control device. Thus, a certain amount of harmonic current is reflected back into the supply line. The amount of harmonic current so reflected can be adjusted depending upon the requirements of the utility system supplying power."

In an example in the T. Kennedy patent it is indicated (on page 4 in lines 109–112) that 70 percent of the harmonic currents are removed and 30 percent of the harmonic currents are reflected into the AC power line. Further, it is indicated (on page 4 in lines 112–115) that "(i)f the utility requirements on harmonics are more severe, it is possible to remove an even higher percentage such as 75%."

Although of some value in reducing the level of some of the harmonic currents, it is important to note that the reductions in the levels of harmonic currents afforded by the network disclosed in the above-mentioned T. Kennedy patent does not approach that required to meet the above mentioned standard.

In the U.S. Pat. No. 4,222,096 of D. Capewell and the U.S. Pat. No. 4,369,490 of F. Blum a circuit is disclosed which includes a capacitor connected in parallel with the input of the bridge rectifier of a (capacitor-input-type) DC power supply and an inductor connected between the AC power line and the input of the rectifier to couple the DC power supply to the AC power line. In the F. Blum patent it is indicated (on column 5 in lines 23–29) that without the above-mentioned circuit, the DC power supply was found to present a power factor of 65 percent to the AC power line. Also, it was found that without the above-mentioned circuit, the level of the third harmonic current was 88 percent, the level of the fifth harmonic current was 65 percent, and the level of the seventh harmonic current was 38 percent of the level of the fundamental current. In one example, With the above-mentioned circuit, the DC power supply was found to present a power factor of 94 percent to the AC power line. Also, with the above-mentioned circuit, the level of the third harmonic current was 20 percent, the level of the fifth harmonic current was 6 percent, and the level of the seventh harmonic current was 2 percent of the level of the fundamental current.

Although the above-mentioned circuit greatly increases the power factor a DC power supply presents to an AC power line and greatly reduces the levels of the harmonic currents, It is important to note that the DC power supply (and circuit combination) still does not even come close to meeting the above-mentioned military standard.

The U.S. Pat. No. 3,461,372 of Clive Pickup et al. shows (in the sole figure) what is referred to in the Patent as a "D.C. to A.C. power converter". Shown is a switching transistor (3) configured to alternately switch on and off power from a DC source (Vc) responsive to a square wave (1–2), a plurality of series resonant "circuits" (4–5, 6–7, and 8–9) configured to "attenuate" lower even harmonics, and a plurality of parallel resonant "circuits" (10–11, 12–13, and 14–15) configured to "block" odd harmonics, the combination to provide a sinusoidal output across a load (R1). More specifically, the collector of the transistor (3) is coupled to the D.C. source (Vc) by an inductance (Lf). Further, the plurality of series resonant "circuits" (4–5, 6–7, and 8–9) are each connected between the collector and the emitter of the transistor (3). Finally, the plurality of parallel resonant "circuits" (10–11, 12–13, and 14–15) are connected between the collector and the output. It is indicated (in column 2, lines 39–41) that the plurality of series resonant "circuits" (4–5, 6–7, and 8–9) are each tuned to a different even harmonic ($2f$, $4f$, and $6f$ being shown in the figure). Further, it is indicated (in column 2, lines 41–44) that the inductance (Lf) is parallel resonant at the driving frequency with the effective capacitance of all the series resonant "circuits" (4–5, 6–7, and 8–9). Finally, it is indicated (in column 2, lines 44–47) that the parallel resonant "circuits" are resonant at the odd order harmonics ($3f$, $5f$, and $7f$ being shown in the figure). It is important to note that the C. Pickup, et al Patent does not pertain to D.C. power supplies nor power factor, let alone the power factor a D.C. power supply presents to an AC power line.

Performance characteristics were calculated for a circuit in which a (capacitor-input-type) DC power supply was coupled to an AC power line by means of three parallel-resonant series-connected inductor-capacitor-type "circuits", which were, respectively, resonant at the third, the fifth, and the seventh harmonic frequencies of the AC power line frequency. In addition, three series-resonant shunt-connected inductor-capacitor-type "circuits" were connected across the AC power line, which were, respectively, resonant at the second, the fourth, and the sixth harmonic frequencies of the AC power line frequency. Finally, connected across the AC power line, was an inductor, having an inductance chosen to parallel resonant at the power line frequency with the effective capacitance of all the series resonant "circuits". The three parallel-resonant series-connect inductor-capacitor-type "circuits" had a Q of ½; and, the three series-resonant shunt-connected inductor-capacitor-type "circuits" had a Q of one, as employed (below) in the present invention. A sine wave AC power line potential; and, a 144 ohm load were used. Again, as previously indicated, small resistors were included in series with various components to facilitate the calculations. The total harmonic distortion was reduced to 15.6%. However, it is important to note the DC power supply only developed a DC potential of 122 volts across the load, as compared to the 162 volt DC potential which was developed by the DC power supply across the 200 ohm (131 watt) load when directly connected across the AC power line.

Next, the performance characteristics were calculated for a circuit in which the DC power supply was coupled to the AC power line by means of a network which includes various parallel-resonant series-connected inductor-capacitor-type "circuits" and various series-resonant shunt-connected inductor-capacitor-type "circuits". The "circuits" were all resonant at odd harmonic frequencies of the AC power line frequency (third, fifth, seventh, etc.).

| | | Harmonic currents generated on an AC power line by a DC power supply coupled to the line by a number of series-connected parallel-resonant "circuits", a number of series-resonant "circuits" being connected across the AC power line. | | | | |
|---|---|---|---|---|---|---|
| # of series resonant circuits | # of parallel resonant circuits | Load | Power | Freq. | Output Voltage | Dist. |
| 0 | 0 | 200 Ohms | 131 W | 60 Hz | 162 V DC | 157% |
| 1 | 1 | 200 Ohms | 97 W | 60 Hz | 139 V DC | 47% |
| 1 | 1 | 100 W | 100 W | 60 Hz | 138 V DC | 49% |
| 2 | 2 | 200 Ohms | 87 W | 60 Hz | 132 V DC | 43% |
| 2 | 2 | 100 W | 100 W | 60 Hz | 131 V DC | 39% |
| 3 | 3 | 200 Ohms | 85 W | 60 Hz | 130 V DC | 44% |
| 3 | 3 | 100 W | 100 W | 60 Hz | 127 V DC | 40% |
| 4 | 4 | 200 Ohms | 81 W | 60 Hz | 127 V DC | 46% |
| 4 | 4 | 100 W | 100 W | 60 Hz | 120 V DC | 43% |
| 5 | 5 | 200 Ohms | 77 W | 60 Hz | 124 V DC | 47% |
| 5 | 5 | 100 W | 100 W | 60 Hz | 103 V DC | 45% |
| 6 | 6 | 200 Ohms | 73 W | 60 Hz | 121 V DC | 48% |
| 6 | 6 | 100 W | 100 W | 60 Hz | 103 V DC | 48% |

Again, it is important to note the relatively low DC potential which was developed across the load, as compared to the 162 volt DC potential which was developed by the DC power supply across the 200 ohm (131 watt) load when directly connected across the AC power line (zero (0) "LC-filters"). Further, it is important to note the relatively poor regulation provided. Also, it is interesting to note that the level of certain harmonics increased as additional "circuits" were added.

The German patent (Offenlegungsschrift, 1,927,415, Jan. 2, 1979) of Hemesh Laxmidas Thanawala dated Jan. 2, 1970, "concerns an arrangement for high-voltage direct-current-transmission by connecting an alternating-current-network with a direct-current-network over a static frequency-changer and a transformer." Apparently, the object of the invention is to provide a "filter" permitting the reduction of the leakage inductance (and, thus, the size) of the transformer and the size of the thyratron tubes. shown in block form are (just) two basic topologies. However, each block is to be replaced by one, or more, networks chosen from thirteen basic resistor-capacitor-inductor networks, which are, also, shown.

More specifically, FIGS. 1a, 1b, and 2 are similar, FIGS. 1a and 1b taking an abstract form and FIG. 2 taking a combined schematic and block form. Each of these figures (FIGS. 1a, 1b, and 2) shows the combination of a three-phase network (1), a transformer (2), and a static rectifier (3), which is coupled to the network by the transformer. In addition, FIGS. 1a and 1b show a block labeled "F" (4); and, FIG. 2 show three blocks, which are respectively labeled "Fa", "Fb", and "Fc". In FIG. 1a, the block labeled "F" (4) is shown connected between the three-phase network (1) and a point "E", having earth potential; and, in FIG. 1b, the block labeled "F" (4) is shown connected between the transformer (2) and point "E". In FIG. 2, each of the blocks ("Fa", "Fb", and "Fc") is shown connected between a respective line of the three-phase network and point "E". In other words, the block(s) are connected in a simple "shunt" configuration. The blocks labeled "F" (4) and "Fa", "Fb", and "Fc" are referred to as "parallelfilters".

FIGS. 6 and 7 of the Thanawala patent are similar, FIG. 6 taking an abstract form and FIG. 7 taking a combined schematic and block form. Again, FIGS. 6 and 7 each shows the combination of a three-phase network (1), a transformer (2), and a static rectifier (3), which is connected to the transformer. However, FIGS. 6 shows three blocks, which are respectively labeled "F3", "F2", and "F1". The three blocks ("F3", "F2", and "F1") are connected in a "pi" configuration. Specifically, the block labeled "F3" is connected between the three-phase network (1) and the transformer (2). The block labeled "F2" is connected between the three-phase network (1) and point "E"; and, block labeled "F1" is connected between the transformer (2) and point "E". FIGS. 7 shows three sets of three blocks, which are, again, respectively, labeled "F3", "F2", and "F1". Each set of three blocks ("F3", "F2", and "F1") is connected in the "pi" configuration, one set for each line of the three-phase network (1). The blocks labeled "F3" are referred to both as "rejector-circuits" and as "filters"; and, the blocks labeled "F2" and "F1" are, again, referred to as "parallelfilters".

For use in the "filter" blocks, the Thanawala patent shows thirteen basic resistor-capacitor-inductor sub-networks. Shown in FIG. 3a of the Thanawala patent is the series combination of a capacitor, an inductor and a resistor; the series combination of a capacitor and a resistor is shown in FIG. 3b; a capacitor connected in series with an inductor, which is connected in parallel with a resistor, is shown in FIG. 3c; in FIG. 3d a capacitor is shown connected in series with an inductor, which is connected in parallel with the series combination of another capacitor and a resistor; and just a single capacitor is shown in FIG. 3e. In FIG. 5a of the Thanawala patent is shown the parallel combination of a capacitor, an inductor and a resistor; the parallel combination of a capacitor and a resistor is shown in FIG. 5b; a capacitor connected in series with a resistor, which is connected in parallel with an inductor, is shown in FIG. 5c; in FIG. 5d an inductor is shown connected in parallel with the series combination of a capacitor and the parallel combination of an inductor and a resistor; and just a single inductor is shown in FIG. 5e. FIG. 9a shows the series combination of an inductor and a capacitor, the combination connected in parallel with the series combination of another capacitor and a resistor. In FIG. 9b a capacitor is shown connected in series with an inductor, which is connected in parallel with the series combination of another capacitor and a resistor.

Finally, in FIG. 9c, a capacitor is shown connected in parallel with a block.

In the translation, it is indicated that the "filter" block sub-networks (shown in FIGS. 3a-3e, 5a-5e, and 9a-9c of the Thanawala patent) are tuned to the "harmonics one wants to suppress" (page 3, line 2, of the translation). Further, it is indicated that the "F1" block is for "drawing away the harmonics from point C . . . to earth" (page 2, line 37, of the translation); that the "F2" block is for "drawing away the harmonics from point C . . . to earth" (page 2, line 38, of the translation); and, that the "F3" block is for "suppressing undesirable harmonics" (page 2, line 52, to page 3, line 1, of the translation). As an example, it is indicated (page 2, lines 43-50, of the translation) that the three sub-networks (parallel branches) shown in FIG. 4 can be tuned to the 5th, 7th, and 11th "or a higher harmonic". In other words, the "filter" block sub-networks are tuned to the ODD harmonics, including the the "filter" block sub-networks shown in FIGS. 3a-3e.

It is important to note how many different configuration are encompassed by the Thanawala patent. Considering only one phase of the three phases of the structure shown in block form in FIG. 7 (of the Thanawala patent) and considering only the choices shown in FIGS. 3a-3e, 5a-5e and 9a-9c, "F1" can have at least three sub-networks (as shown in FIG. 4) each chosen from one of the five choices shown in FIGS. 3a-3e; "F2" can have at least one sub-network chosen from the five choices shown in FIGS. 3a-3e; and, "F3" can have at least two sub-networks (as shown in FIG. 8) each chosen from one of the eight choices shown in FIGS. 5a-5e and 9a-9c. In other words, there are, approximately, (5)(5)(4)(5)(8)(8) or (32,00) choices for one phase of FIG. 7 alone. In addition, each of these sub-networks can be tuned to different harmonics. Considering only the 3rd, 5th, 7th, 9th, 11th, and 13th harmonics, there are six choices for each sub-network, (5)(6)(5)(6)(4)(6)(5)(6)(8)(6)(8)(6) or (1,492,992,000) choices. Further, each of these sub-networks can have a different Q.

Further, it is important to note that Thanawala considers the various blocks to be "filters"; and, thus, teaches that filter considerations should be employed in selecting, tuning and choosing the Q of the various sub-networks (shown in FIGS. 3a-3e, 5a-5e, and 9a-9c of the patent).

In a more modern system, the "pi" filter of the Thanawala patent is problematic in that "filter" block "F2" is connected directly across the AC power line. As connected, this "filter" block presents a low impedance to harmonics generated elsewhere in the AC power system. Consequently, the "filter" block is subject to overload.

For purposes herein, it is important to note that none of the topologies shown in the Thanawala patent (neither the simple shunt topology shown in FIGS. 1a, 1b, and 2, nor the "pi" topology shown in FIGS. 6 and 7) are the same as any of the topologies of the present invention. Further, none of the sub-networks of FIGS. 3a-3e, or any of the other figures shows a simple series connected inductor-capacitor network, as employed in the "resonators" of the present invention. Further, none of the sub-networks of FIGS. 5a-5e, or any of the other figures shows a simple parallel connected inductor-capacitor network, as employed in the principal "reflectors" of the present invention.

The reader may also find of interest, the U.S. Pat. No. 2,138,996 of Alan D. Blumlein; the U.S. Pat. No. 2,008,515 of Walter Plathner et al; the U.S. Pat. No. 4,591,963 of Daniel D. Retotar; the British patent 221,850 of Ernest Y. Robinson; the German patent 659,504; the article entitled "Filter Design Simplified" by Berthold Sheffield from *Audio Engineering* Vol. 35, No. 5, pages 26, 28, and 58; and the article entitled "Computer-Aided, Lumped-Element Filter Design and Analysis" by A. Kwon from Microwave Journal March 1976, pages 53, 54, and 57.

SUMMARY OF THE PRESENT INVENTION

It is therefor the primary object of the present invention to provide a means by which DC power supplies may be made to meet the DOD-STD-1399(NAVY) SECTION 300 1 AUG. 1978 standard.

Another object of the present invention to provide a means by which DC power supplies may be made to meet commercial/industrial standards.

Another object of the present invention is to provide a means by which the levels of harmonic currents generated on an AC power line by a DC power supply may be reduced, without appreciably degrading the performance of the DC power supply.

Still another object of the present invention is to provide a means by which the power factor a DC power supply presents to an AC power line may be improved, without appreciably degrading the performance of the DC power supply.

Briefly, the presently preferred embodiment of the present invention employs, in combination, at least one "resonator", which is connected across the input of a DC power supply, and at least one "reflector", which is connected to couple the input of the DC power supply to an AC power line. Each "resonator", includes the series combination of an inductor and a capacitor. At least some of the "reflectors" include the parallel combination of an inductor and a capacitor. (In FIG. 2, the sole "resonator" includes inductor 170 and capacitor 172; and, one of the two "reflectors" includes inductor 150 and capacitor 152.) The "resonator(s)" provide(s) the harmonic currents which the DC power supply requires for proper operation; and, the "reflector(s)" reflect(s) the harmonic energy back toward the power supply. In order to attenuate the level of higher order harmonic currents, in some embodiments, a "reflector" is employed which includes, at least, an inductor and a resistor. (In FIG. 2, such a "reflector" includes inductor 140 and resistor 144.) The number of "resonators" and the number of "reflectors" vary with the application. In many applications, only one "resonator" and one "reflector" are required. However, all applications require at least one of each.

These and other objects of the present invention will no doubt be obvious to those skilled in the art after having read the following detailed description of the presently preferred embodiments which are illustrated in the several figures of the drawing.

IN THE DRAWING

FIG. 1 is a schematic diagram of an embodiment in accordance with the present invention of a three-phase harmonic currents isolating network for military applications;

FIG. 2 is a schematic diagram of the presently preferred embodiment in accordance with the present invention of a harmonic currents isolating network for commercial/industrial applications;

FIG. 3 is a schematic diagram of a harmonic currents isolating network for more stringent commercial/industrial applications;

FIG. 4 is a schematic diagram of a three "reflector" harmonic currents isolating network in accordance with the present invention; and FIG. 5 is a diagram illustrating a number of the waveforms associated with the three "reflector" harmonic currents isolating network shown in FIG. 4.

DETAILED DESCRIPTION OF THE PREFERRED EMBODIMENTS

In accordance with the present invention, illustrated in FIG. 1 of the drawing generally designated by the number 10 is an embodiment of a three-phase, military grade network for isolating from an AC power line the harmonic currents generated by a DC power supply. Also illustrated with network 10 is a (three phase) AC power line, generally designated 12, and a (capacitor-input-type) DC power supply, generally designated 14. Network 10 is shown to employ three terminals (nodes), respectively designated 20, 20', and 20", each for connection to a respective conductor of AC power line 12 and three terminals (nodes), respectively designated 22, 22', and 22", each for connection to DC power supply 14.

Network 10 also employs three similar portions, respectively designated 30, 30', and 30", each connected between a respective one of terminals 20, 20', and 20" and a respective one of terminals 22, 22', and 22". (Herein, similar one of terminals 22, 22', and 22". (Herein, similar portions/components are similarly numbered.) Additionally, network 10 employs three similar portions, respectively designated 32, 32', and 32", each connected between a respective pair of terminals 20 and 20', 20' and 20", and 20" and 20.

Portion 30 includes an inductor (choke) 40 which is connected between terminal 20 and a node 42. Additionally, portion 30 includes a resistor 44 and a capacitor 46 which are connected in series between terminal 20 and node 42. Further, portion 30 includes an inductor 50 and a capacitor 52, the combination (of inductor 50 and capacitor 52) being connected in parallel (parallel resonant) between node 42 and a node 54. Finally, portion 30 includes an inductor 58 and a capacitor 60, the combination (of inductor 58 and capacitor 60) being connected in parallel (parallel resonant) between node 54 and terminal 22.

Portion 32 includes an inductor 70 and a capacitor 72, the combination (of inductor 70 and capacitor 72) being connected in series (series resonant) between terminals nodes 22 and 22'.

DC power supply 14 employs a bridge rectifier 80 and a filter capacitor 82. The input of rectifier 80 is connected to terminals 22, 22', and 22"; and, the output of the rectifier is (in this case) directly connected across capacitor 82 (between a pair of terminals 84 and 86) to develop a DC (output) potential (between the terminals) across the capacitor. A load (for DC power supply 14) is represented by a resistor 90 connected between terminals 84 and 86. Bridge rectifier 80 includes three rectifier diodes (not shown) each having a cathode coupled to terminal 84 and an anode coupled to a respective one of terminals 22, 22', and 22". Further, bridge rectifier 80 includes three more diodes (also not shown) each having an anode coupled to terminal 86 and a cathode coupled to a respective one of terminals 22, 22', and 22".

The inductor (70, 70', or 70") and capacitor (72, 72', or 72") combination of each of portions 32, 32', and 32" form (what is referred to herein as) a "resonator" for (in conjunction with power supply 14) generating harmonic currents for the power supply. In the presently preferred embodiment, the inductance of the inductor (70, 70', or 70") and the capacitance of the capacitor (72, 72', or 72") are chosen such that each inductor-capacitor combination resonates at a frequency near the twelfth harmonic frequency of the power-line frequency and has a Q of approximately one.

The inductor-capacitor combinations of portion 30 (40 and 46, 50 and 52, and 58 and 60) (as well as the similar combinations of portions 30' and 30") form (what is referred to herein as) "reflectors" for (it is believed) coupling energy at the AC power line frequency from AC power line 12 to the "reflector(s)" and DC power supply 14 and for reflecting harmonic energy back toward the power supply. In the presently preferred embodiment, inductor 58 and capacitor 60 resonate near the seventh harmonic frequency; inductor 50 and capacitor 52 resonate near the fifth harmonic frequency; and, inductor 40 and capacitor 46 resonate near the thirteenth harmonic frequency. Each of the inductor-capacitor combinations of the "reflectors" have a Q which is in the range of 0.5 to 3. It is important to note that to attenuate the level of higher order harmonic currents, a resistor (44) is included in series with the capacitor (46) in the highest frequency "resonator". The resistor (44) resistance is approximately equal to the characteristic impedance of each of the "resonators" (each of portions 32, 32', and 32"). Finally, it is important to note that no inductor-capacitor combination resonates at an exact multiple of the resonate frequency of another inductor-capacitor combination; because, it has been observed that certain combinations of frequency and Q have resulted in excessive levels of harmonic currents in the line.

In the presently preferred embodiment, the following component values are employed for the three-phase, military guide network shown in FIG. 1:

| | |
|---|---|
| inductor 40 | 2.41 mH, |
| resistor 44 | 12 ohms, |
| capacitor 46 | 23.2 mfd, |
| inductor 50 | 2.84 mH, |
| capacitor 52 | 97.4 mfd, |
| inductor 58 | 2.43 mH, |
| capacitor 60 | 46.9 mfd, |
| inductor 70 | 3.55 mH, |
| capacitor 72 | 10.95 mfd, |
| capacitor 82 | 3000 mfd, and |
| resistor 90 | a constant 2000 watt load (such as is presented by a switching power supply and its load). |

The following performance characteristics were calculated for the three-phase, military grade network shown in FIG. 1 by means of the above-mentioned computer:

| | 57 Hz | 60 Hz | 63 Hz |
|---|---|---|---|
| level of the harmonic currents relative the fundamental | | | |
| 5th | 1.75% | 0.73% | 2.10% |
| 7th | 2.85% | 1.78% | 1.10% |
| 11th | 1.71% | 1.42% | 1.66% |
| 13th | 1.30% | 0.79% | 0.68% |

-continued

|  | 57 Hz | 60 Hz | 63 Hz |
|---|---|---|---|
| 17th | 0.96% | 0.84% | 0.57% |
| 23rd | 0.49% | 0.87% | 0.58% |
| 25th | 0.16% | 0.38% | 0.49% |
| total harmonic distortion | | | |
|  | 4.12% | 2.82% | 3.12% |
| phase angle in degrees | | | |
|  | 14 leading | 13 leading | 15 leading |
| voltage level developed across the load (resistor 90) | | | |
|  | 144 V DC | 144.4 V DC | 146.6 V DC |

To illustrate the function of the "resonators" (70-72, 70'-72', and 70''-72''), performance characteristics were calculated for the three-phase, military grade network shown in FIG. 1, WITHOUT the "resonators". At 60 Hz, the voltage level developed across the load (resistor 90) dropped to 119 volts; and, the total harmonic distortion increased to 4.8%. Further, performance characteristics were calculated for for the three-phase, military grade network shown in FIG. 1, with the "resonators" RELOCATED to each be across a respective phase of the AC power line. At 60 Hz, the voltage level developed across the load (resistor 90), again, dropped to 119 volts; and, the total harmonic distortion increased to 4.9%. Finally, to illustrate the function of the resistors (44, 44', and 44''), performance characteristics were calculated for the three-phase, military grade network shown in FIG. 1, WITHOUT the resistors.

The following performance characteristics were calculated for the three-phase, military grade network shown in FIG. 1 WITHOUT the resistors:

|  | 57 Hz | 60 Hz | 63 Hz |
|---|---|---|---|
| level of the harmonic currents relative the fundamental | | | |
| 5th | 1.77% | 0.59% | 2.07% |
| 7th | 2.47% | 1.61% | 1.04% |
| 11th | 0.36% | 0.13% | 0.02% |
| 13th | 0.30% | 0.24% | 0.02% |
| 17th | 0.81% | 1.06% | 0.62% |
| 23rd | 1.28% | 2.09% | 1.65% |
| 25th | 1.42% | 2.26% | 1.84% |
| 29th | 1.59% | 1.99% | 1.62% |
| 31st | 1.66% | 1.80% | 1.49% |
| 35th | 1.25% | 1.05% | 0.83% |
| 37th | 1.04% | 0.72% | 0.57% |
| 49th | 0.57% | 0.46% | 0.56% |
| 61st | 0.37% | 0.17% | 0.28% |
| total harmonic distortion | | | |
|  | 4.89% | 5.05% | 4.49% |
| voltage level developed across the load (resistor 90) | | | |
|  | 144 V DC | 144.4 V DC | 146.6 V DC |

Turning now to FIG. 2, the presently preferred embodiment of a commercial/industrial grade harmonic currents isolating network is illustrated generally designated 110. With network 110 is illustrated a (single phase) AC power line, generally designated 112, and another (capacitor-input-type) DC power supply, generally designated 114. Network 110 is shown to employ two terminals (nodes), respectively designated 120 and 120', each for connection to a respective conductor of AC power line 112 and two terminals (nodes), respectively designated 122 and 122', each for connection to DC power supply 114.

Network 110 employs two "reflectors" and one "resonator". The first "reflector" includes an inductor 140, which is connected between terminal 120 and a node 142. Additionally, the first "reflector" includes a resistor 144 and a capacitor 146 which is connected in series with resistor 144 between terminal 120 and node 142. The second "reflector" includes another inductor 150 and another capacitor 152 which are connected in parallel between node 142 and terminal 122. Finally, the "resonator" includes still another inductor 170 and still another capacitor 172 connected in series between terminals 122 and 122'. Terminal 120' is directly coupled (connected) to terminal 122'.

DC power supply 114 employs a bridge rectifier 180 and a filter capacitor 182. The input of rectifier 180 is connected to terminals 122 and 122'; and, the output of the rectifier is directly connected across capacitor 182 (between a pair of terminals 184 and 186) to develop a DC (output) potential (between the terminals) across the capacitor. A load (for DC power supply 114) is represented by a resistor 190 connected between terminals 184 and 186.

In the presently preferred embodiment, the inductance of the inductor (170) and the capacitance of the capacitor (172) of the "resonator" are chosen such that they resonate at a frequency near the sixth harmonic frequency of the power-line frequency and have a Q of approximately one to generate currents at both the fifth and the seventh harmonic frequencies. Additionally, the (inductor 170 and capacitor 172) "resonator" generates an appreciable amount of third harmonic current without the high no load voltage characteristic of a "resonator" resonate at a lower frequency. The "reflector" which includes inductor 150 and capacitor 152 resonates at a frequency near the fifth harmonic frequency and has a Q of approximately one. The other "reflector", which includes inductor 140 and capacitor 146, resonates near the seventh harmonic frequency and has a Q of approximately $\frac{3}{4}$. In this embodiment, no "reflector" resonant near the third harmonic frequency is employed. Rather, at the third harmonic frequency the off-resonant impedance of the other "reflectors" (150-152 and 140-146) is considered sufficient for many applications. The resistor (144) resistance is approximately equal to the characteristic impedance of the "resonator".

In the presently preferred embodiment, the following component values are employed for the commercial/industrial grade harmonic currents isolating network shown in FIG. 2:

| inductor 140 | 36 mH, |
|---|---|
| resistor 144 | 115 ohms, |
| capacitor 146 | 4.84 mfd, |
| inductor 150 | 67.2 mH, |
| capacitor 152 | 5.08 mfd, |
| inductor 170 | 56.5 mH, |
| capacitor 172 | 4.27 mfd, |
| capacitor 182 | 600 mfd, and |
| resistor 190 | a constant 200 ohm resistive load consuming approximately 100 watts. |

The following performance characteristics were calculated for the commercial/industrial network shown in FIG. 2:

|  | 47 Hz | 50 Hz | 53 Hz | 57 Hz | 60 Hz | 63 Hz |
|---|---|---|---|---|---|---|
| level of the harmonic currents relative the fundamental | | | | | | |
| 3rd | 34.59% | 33.86% | 31.13% | 19.83% | 15.20% | 13.20% |
| 5th | 2.87% | 2.36% | 1.10% | 0.91% | 1.35% | 1.01% |
| 7th | 0.82% | 4.50% | 8.76% | 9.03% | 8.85% | 8.14% |
| 9th | 3.81% | 2.03% | 4.57% | 4.84% | 5.56% | 5.85% |
| 11th | 4.66% | 2.91% | 0.91% | 0.46% | 1.11% | 1.72% |
| 13th | 3.20% | 3.01% | 1.11% | 1.71% | 1.66% | 1.44% |
| 15th | 1.37% | 2.22% | 1.61% | 1.63% | 1.89% | 1.95% |
| 17th | 0.69% | 1.17% | 1.48% | 0.37% | 0.66% | 0.89% |
| 19th | 1.28% | 0.55% | 1.01% | 0.70% | 0.63% | 0.54% |
| power factor | | | | | | |
|  | 0.91 | 0.91 | 0.90 | 0.89 | 0.93 | 0.94 |
| voltage level developed across the load (resistor 190) | | | | | | |
|  | 134 V DC | 135 V DC | 138 V DC | 143 V DC | 144 V DC | 143 V DC |

To illustrate the performance of the commercial/industrial grade harmonic currents isolating network shown in FIG. 2 as a function of the series impedance presented by the network to the AC power line at the power line frequency, computations were performed on variations of the network in which the inductance (but not the resonant frequency) of the "reflectors" was changed. First, a "resonator" impedance of 165 Ohms at 5.5 Times the AC power line frequency was employed; and, next, a "resonator" impedance of 240 Ohms at 5.5 Times the AC power line frequency was employed. (A constant, 100 watt, load was employed.) It is important to note how the power factor improves as the series inductance increases.

| Component Values | #1 | #2 | #3 | #4 | #5 | #6 |
|---|---|---|---|---|---|---|
| "Reflector" (140-144-146) | | | | | | |
| Resonant Frequency | 7th | 7th | 7th | 7th | 7th | 7th |
| (140) in H. | .0134 | .0191 | .0248 | .0306 | .0382 | .0497 |
| (146) in Mfd | 10.70 | 7.520 | 5.790 | 4.700 | 3.760 | 2.890 |
| (144) in Ohms | | | | | | |
| "Reflector" (150-152) | | | | | | |
| Resonant Frequency | 5th | 5th | 5th | 5th | 5th | 5th |
| (150) in H. | .0134 | .0191 | .0248 | .0306 | .0382 | .0497 |
| (152) in Mfd | 21.00 | 14.70 | 11.30 | 9.210 | 7.370 | 5.670 |
| "Resonator" (170-172) | | | | | | |
| Resonant Frequency | 5.5 | 5.5 | 5.5 | 5.5 | 5.5 | 5.5 |
| (170) in H. | .0796 | .0796 | .0796 | .0796 | .0796 | .0796 |
| (172) in Mfd | 2.920 | 2.920 | 2.920 | 2.920 | 2.920 | 2.920 |
| For a "Resonator" Impedance of 165 Ohms at 5.5 Times the AC Power Line Frequency | | | | | | |
| Performance Characteristics | | | | | | |
| Total Series Inductance in Henrys | .0268 | .0382 | .0496 | .0612 | .0764 | .0994 |
| Average DC Output Voltage in Volts | 135.0 | 133.0 | 133.5 | 135.5 | 136.5 | 140.5 |
| Power Factor | 0.649 | 0.768 | 0.825 | 0.861 | 0.886 | 0.917 |
| Harmonic Levels | | | | | | |
| 3rd | 90.0% | 65.0% | 51.0% | 42.0% | 33.0% | 24.0% |
| 5th | 2.3% | 1.4% | 1.0% | 0.9% | 0.8% | 0.6% |
| 7th | 13.0% | 17.0% | 18.0% | 15.0% | 12.0% | 8.5% |
| 9th | 6.0% | 4.1% | 4.8% | 4.5% | 4.2% | 3.6% |
| 11th | 4.8% | 5.0% | 3.2% | 2.6% | 1.9% | 1.0% |

| Component Values | #1 | #2 | #3 | #4 | #5 | #6 |
|---|---|---|---|---|---|---|
| "Reflector" (140-144-146) | | | | | | |
| Resonant Frequency | 7th | 7th | 7th | 7th | 7th | 7th |
| (140) in H. | .0134 | .0191 | .0248 | .0306 | .0382 | .0497 |
| (146) in Mfd | 10.70 | 7.520 | 5.790 | 4.700 | 3.760 | 2.890 |
| (144) in Ohms | | | | | | |
| "Reflector" (150-152) | | | | | | |
| Resonant Frequency | 5th | 5th | 5th | 5th | 5th | 5th |
| (150) in H. | .0134 | .0191 | .0248 | .0306 | .0382 | .0497 |
| (152) in Mfd | 21.00 | 14.70 | 11.30 | 9.210 | 7.370 | 5.670 |
| "Resonator" (170-172) | | | | | | |
| Resonant Frequency | 5.5 | 5.5 | 5.5 | 5.5 | 5.5 | 5.5 |
| (170) in H. | .1160 | .1160 | .1160 | .1160 | .1160 | .1160 |
| (172) in Mfd | 2.010 | 2.010 | 2.010 | 2.010 | 2.010 | 2.010 |
| For a "Resonator" Impedance of 240 Ohms at 5.5 Times the AC Power Line Frequency | | | | | | |
| Performance Characteristics | | | | | | |
| Total Series Inductance in Henrys | .0268 | .0382 | .0496 | .0612 | .0764 | .0994 |
| Average DC Output Voltage in Volts | 138.0 | 133.0 | 130.5 | 131.5 | 132.5 | 133.5 |
| Power Factor | 0.682 | 0.751 | 0.832 | 0.851 | 0.886 | 0.897 |
| Harmonic Levels | | | | | | |
| 3rd | 80.0% | 63.0% | 50.0% | 42.0% | 34.0% | 27.0% |
| 5th | 1.8% | 1.2% | 0.9% | 0.9% | 0.9% | 0.8% |
| 7th | 15.0% | 18.0% | 20.0% | 18.0% | 15.0% | 11.0% |
| 9th | 11.0% | 3.0% | 4.2% | 3.4% | 3.1% | 2.8% |
| 11th | 2.6% | 4.6% | 3.6% | 2.7% | 2.0% | 1.4% |

For more stringent applications, a commercial/industrial grade harmonic currents isolating network is illustrated in FIG. 3 generally designated 210. Network 210 employs two terminals (nodes), respectively designated 220 and 220', each for connection to a respective conductor of an AC power line and two terminals (nodes), respectively designated 222 and 222', each for connection to a DC power supply. Additionally, network 210 employs five "reflectors" connected in series between terminals 220 and 222 and two "resonators". The first three "reflectors" include the parallel connection of an inductor 240 and a resistor 244 in the first; the parallel connection of an inductor 250 and a capacitor 252 in the second; and an inductor 258 and a capacitor 260 in the third. Connected between the third and fourth "reflector", the first "resonator" includes an inductor 270 and a capacitor 272 connected in series between a node 274 and terminal 222'. The last two "reflectors" include the parallel combination of an inductor 340 and a capacitor 346 in the fourth and the parallel connection of an inductor 350 and a capacitor 352 in the fifth. Finally, the last (second) "resonator" includes an inductor 370 and a capacitor 372 connected in series between terminals 222 and 222'. Terminal 220' is directly coupled (connected) to terminal 222'.

In the presently preferred embodiment, the following component values are employed for the commercial/industrial grade harmonic currents isolating network illustrated in FIG. 3:

| | | | | |
|---|---|---|---|---|
| inductor 240 | 30 mH, | | | |
| resistor 244 | 115 ohms, | | | |
| inductor 250 | 30.5 mH, | | | |
| capacitor 252 | 9.23 mfd, | freq. | 5th harmonic, Q | ½, |
| inductor 258 | 21.8 mH, | | | |
| capacitor 260 | 6.59 mfd, | freq. | 7th harmonic, Q | ½, |
| inductor 270 | 102 mH, | | | |
| capacitor 272 | 7.66 mfd, | freq. | 3rd harmonic, Q | 1, |
| inductor 340 | 16.9 mH, | | | |
| capacitor 346 | 5.12 mfd, | freq. | 9th harmonic, Q | ½, |
| inductor 350 | 13.9 mH, | | | |
| capacitor 352 | 4.19 mfd, | freq. | 11th harmonic, Q | ½, |
| inductor 370 | 51 mH, and | | | |
| capacitor 372 | 3.84 mfd, | freq. | 6th harmonic, Q | 1, | a DC power supply capacitor capacitance of 600 mfd, and a constant 200 ohm resistive load consuming approximately 100 watts.

The following performance characteristics were calculated for the commercial/industrial grade harmonic currents isolating network illustrated in FIG. 3:

| | 57 Hz | 60 Hz | 63 Hz |
|---|---|---|---|
| level of the harmonic currents relative the fundamental | | | |
| 3rd | 7.89% | 1.03% | 6.60% |
| 5th | 1.12% | 0.42% | 2.74% |
| 7th | 0.42% | 0.21% | 0.36% |
| 9th | 1.52% | 0.32% | 1.91% |
| 11th | 0.89% | 0.37% | 0.89% |
| 13th | 2.07% | 0.74% | 1.17% |
| 15th | 3.64% | 1.78% | 2.26% |
| 17th | 1.39% | 2.02% | 1.88% |
| 19th | 1.55% | 0.82% | 1.97% |
| 21st | 0.79% | 0.68% | 1.15% |
| 23rd | 0.93% | 0.56% | 0.75% |
| 25th | 0.62% | 0.19% | 0.99% |
| 27th | 0.55% | 0.47% | 2.00% |
| 29th | 0.50% | 0.44% | 1.50% |
| 31st | 0.30% | 0.38% | 0.26% |
| total harmonic distortion | | | |
| | 9.55% | 3.37% | 8.87% |
| voltage level developed across the load | | | |
| | 156 V DC | 147.5 V DC | 147 V DC |

To illustrate the function of the "resonator" (270-272 and 370-372), performance characteristics were calculated for the commercial/industrial grade harmonic currents isolating network shown in FIG. 3, WITHOUT the "resonators". At 57 Hz, the voltage level developed across the load dropped to 115 volts; and, the total harmonic distortion increased to 35.2%. Next, at 60 Hz, the voltage level developed across the load dropped to 118 volts. Then, at 63 Hz, the voltage level developed across the load dropped to 121 volts; and, the total harmonic distortion increased to 33.5%. Further, performance characteristics were calculated for the commercial/industrial grade harmonic currents isolating network shown in FIG. 3, with the "resonators" RELOCATED to each be across the AC power line. At 57 Hz, the voltage level developed across the load dropped to 115 volts; and, the total harmonic distortion increased to 30.1%. Next, at 60 Hz, the voltage level developed across the load dropped to 118 volts; and, the total harmonic distortion increased to 34.1%. Then, at 63 Hz, the voltage level developed across the load dropped to 121 volts. Finally, to illustrate the function of the resistor (244), performance characteristics were calculated for the commercial/industrial grade harmonic currents isolating network shown in FIG. 3, WITHOUT the resistor.

The following performance characteristics were calculated for the commercial/industrial grade harmonic currents isolating network illustrated in FIG. 3 WITHOUT the resistor (244):

| | 57 Hz | 60 Hz | 63 Hz |
|---|---|---|---|
| level of the harmonic currents relative the fundamental | | | |
| 3rd | 7.14% | 0.29% | 6.30% |
| 5th | 1.31% | 0.81% | 2.02% |
| 7th | 0.07% | 0.30% | 0.23% |
| 9th | 1.76% | 0.27% | 1.83% |
| 11th | 0.91% | 0.32% | 0.47% |
| 13th | 1.73% | 1.69% | 2.57% |
| 15th | 1.92% | 6.15% | 5.73% |
| 17th | 5.58% | 2.33% | 6.29% |
| 19th | 4.33% | 3.20% | 0.30% |
| 21st | 0.69% | 0.50% | 1.07% |
| 23rd | 1.18% | 0.52% | 0.63% |
| 25th | 0.34% | 0.86% | 0.65% |
| 27th | 0.68% | 0.30% | 0.10% |
| 29th | 0.25% | 0.56% | 0.70% |
| 31st | 0.40% | 0.12% | 0.20% |
| total harmonic distortion | | | |
| | 11.44% | 7.82% | 11.47% |
| voltage level developed across the load | | | |
| | 115 V DC | 118 V DC | 121 V DC |

In another embodiment, inductor 270 and capacitor 272 (of the first "resonator") are connected in series between terminal 222' and a node 400 at the juncture of inductors 340 and 350.

Turning now to FIG. 4, a three "reflector" harmonic currents isolating network is illustrated generally designated 510. With network 510 is illustrated a (single phase) AC power line, generally designated 512, and another (capacitor-input-type) DC power supply, generally designated 514. Network 510 is shown to employ two terminals (nodes), respectively designated 520 and 520', each for connection to a respective conductor of AC power line 512 and two terminals (nodes), respectively designated 522 and 522', each for connection to DC power supply 514.

Network 510 employs three "reflectors" and one "resonator". The first "reflector" includes an inductor 540, which is connected between terminal 520 and a node 542. Additionally, the first "reflector" includes a resistor 544 and a capacitor 546 which is connected in series with resistor 544 between terminal 520 and node 542. The second "reflector" includes another inductor 550 and another capacitor 552 which is connected in parallel with inductor 550 between node 542 and a node 642. The third "reflector" includes yet another inductor 650 and another capacitor 652 which is connected in parallel with inductor 650 between node 642 and terminal 522. The "resonator" includes still another inductor 670 and still another capacitor 672 connected in series between terminals 522 and 522'. Terminal 520' is directly coupled (connected) to terminal 522'. Further, this embodiment of the harmonic currents isolating network employs a "damping" network connected in parallel with the "resonator". Specifically, the "damping" network includes a resistor 674 and a capacitor 676, which is connected in series with the resistor (674) between terminals 522 and 522'.

DC power supply 514 employs a bridge rectifier 680 and a filter capacitor 682. The input of rectifier 680 is connected to terminals 522 and 522'; and, the output of the rectifier is directly connected across capacitor 682 (between a pair of terminals 684 and 686) to develop a DC (output) potential (between the terminals) across the capacitor. Although a load (for DC power supply 514) is represented by a resistor 690 connected between terminals 684 and 686, for the following calculations, a constant, 100 watt load was employed, such as a switching regulator represents.

In the presently preferred embodiment, the inductance of the inductor (670) and the capacitance of the capacitor (672) of the "resonator" are chosen such that they resonate at a frequency near the sixth harmonic frequency of the power-line frequency. The "reflector" which includes inductor 650 and capacitor 652 resonates at a frequency near the third harmonic frequency; resonant at a frequency near the fifth harmonic frequency is the "reflector" which includes inductor 550 and capacitor 552; and, the other "reflector", which includes inductor 540 and capacitor 546, resonates near the seventh harmonic frequency. The resistor (544) resistance is approximately equal to the characteristic impedance of the "resonator". For the "damping" network, the resistor (674) resistance and the capacitor (676) capacitance are chosen to reduce the amplitude of harmonics having a frequency high than the resonant frequency of the highest frequency "reflector", with due regard to the increased power loss. Preferably, these components are chosen to critically damp the equivalent series circuit consisting of the "resonator" inductance, the damping resistor and the series combination of the "resonator" and "damping" network capacitances.

To illustrate the performance of the harmonic currents isolating network shown in FIG. 4 as a function of the series impedance presented by the network to the AC power line at the power line frequency, computations were performed on variations of the network in which the inductance (but not the resonant frequency) of the "reflectors" was changed. First, the series inductance was equally "apportioned" among the three "reflectors"; and, a "resonator" impedance of 240 Ohms at 5.5 Times the AC power line frequency was employed. Next, the series inductance was "apportioned" among the three "reflectors" in a weighted manner; and, a "resonator" impedance of 330 Ohms at 5.5 Times the AC power line frequency was employed. (No damping network was employed.) (Also, again, a constant, 100 watt load was employed.) It is important to note how the power factor changes as the series inductance increases.

| Component Values | #1 | #2 | #3 | #4 | #5 | #6 | #7 | #8 |
|---|---|---|---|---|---|---|---|---|
| "Reflector" (540-544-546) | | | | | | | | |
| Reson. Freq. | 7th | 7th | 7th | 7th | 7th | 7th | 7th | 7th |
| (540) in H. | .0153 | .0191 | .0240 | .0306 | .0382 | .0450 | .0573 | .0649 |
| (546) in Mfd | 9.390 | 7.520 | 5.790 | 4.700 | 3.760 | 3.140 | 2.510 | 2.210 |
| (544) in Ohms | 240 | 240 | 240 | 240 | 240 | 240 | 240 | 240 |
| "Reflector" (550-552) | | | | | | | | |
| Reson. Freq. | 5th | 5th | 5th | 5th | 5th | 5th | 5th | 5th |
| (550) in H. | .0153 | .0191 | .0248 | .0306 | .0382 | .0458 | .0573 | .0649 |
| (552) in Mfd | 18.40 | 14.70 | 11.30 | 9.210 | 7.370 | 6.140 | 4.910 | 4.340 |
| "Reflector" (650-652) | | | | | | | | |
| Reson. Freq. | 3rd | 3rd | 3rd | 3rd | 3rd | 3rd | 3rd | 3rd |
| (650) in H. | .0153 | .0191 | .0248 | .0306 | .0382 | .0458 | .0573 | .0649 |
| (652) in Mfd | 51.10 | 40.90 | 31.50 | 25.50 | 20.50 | 17.10 | 13.60 | 12.00 |
| "Resonator" (670-672) | | | | | | | | |
| Reson. Freq. | 5.5 | 5.5 | 5.5 | 5.5 | 5.5 | 5.5 | 5.5 | 5.5 |
| (670) in H. | .1160 | .1160 | .1160 | .1160 | .1160 | .1160 | .1160 | .1160 |
| (672) in Mfd | 2.010 | 2.010 | 2.010 | 2.010 | 2.010 | 2.010 | 2.010 | 2.010 |
| For a "Resonator" Impedance of 240 Ohms at 5.5 Times the AC Power Line Frequency Performance Characteristics | | | | | | | | |
| Total Series Inductance in Henrys | .0459 | .0573 | .0744 | .0918 | .1146 | .1374 | .1719 | .1947 |
| Average DC Output Voltage in Volts | 137.5 | 139.0 | 141.5 | 142.5 | 144.5 | 145.0 | 143.5 | 141.5 |
| Power Factor | 0.882 | 0.875 | 0.905 | 0.913 | 0.935 | 0.953 | 0.944 | 0.935 |
| Harmonic Levels | | | | | | | | |
| 3rd | 5.5% | 4.0% | 2.2% | 1.5% | 1.0% | 0.6% | 0.5% | 0.4% |
| 5th | 0.5% | 0.2% | 0.2% | 0.1% | 0.1% | 0.1% | 0.2% | 0.1% |
| 7th | 35.0% | 30.0% | 26.0% | 22.0% | 18.0% | 15.0% | 11.0% | 9.8% |
| 9th | 18.0% | 14.0% | 11.0% | 9.0% | 7.2% | 6.1% | 4.9% | 4.1% |
| 11th | 4.9% | 4.0% | 3.6% | 2.9% | 2.1% | 1.6% | 1.0% | 0.9% |

| Component Values | #1 | #2 | #3 | #4 | #5 | #6 |
|---|---|---|---|---|---|---|
| "Reflector" (540-544-546) | | | | | | |
| Resonant Frequency | 7th | 7th | 7th | 7th | 7th | 7th |
| (540) in H. | .0248 | .0306 | .0382 | .0458 | .0573 | .0649 |
| (546) in Mfd | 5.790 | 4.700 | 3.760 | 3.140 | 2.510 | 2.210 |
| (544) in Ohms | 330 | 330 | 330 | 330 | 330 | 330 |

| Component Values | #1 | #2 | #3 | #4 | #5 | #6 |
|---|---|---|---|---|---|---|
| "Reflector" (550-552) | | | | | | |
| Resonant Frequency | 5th | 5th | 5th | 5th | 5th | 5th |
| (550) in H. | .0248 | .0306 | .0382 | .0458 | .0573 | .0649 |
| (552) in Mfd | 11.30 | 9.210 | 7.370 | 6.140 | 4.910 | 4.340 |
| "Reflector" (650-652) | | | | | | |
| Resonant Frequency | 3rd | 3rd | 3rd | 3rd | 3rd | 3rd |
| (650) in H. | .0248 | .0360 | .0382 | .0458 | .0573 | .0649 |
| (652) in Mfd | 31.50 | 25.50 | 20.50 | 17.10 | 13.60 | 12.00 |
| "Resonator" (670-672) | | | | | | |
| Resonant Frequency | 5.5 | 5.5 | 5.5 | 5.5 | 5.5 | 5.5 |
| (670) in H. | .1590 | .1590 | .1590 | .1590 | .1590 | .1590 |
| (672) in Mfd | 1.460 | 1.460 | 1.460 | 1.460 | 1.460 | 1.460 |
| For a "Resonator" Impedance of 330 Ohms at 5.5 Times the AC Power Line Frequency | | | | | | |
| Performance Characteristics | | | | | | |
| Total Series Inductance in Henrys | .0744 | .0918 | .1146 | .1374 | .1719 | .1947 |
| Average DC Output Voltage in Volts | 138.5 | 139.0 | 140.5 | 142.5 | 142.5 | 141.5 |
| Power Factor | 0.913 | 0.953 | 0.926 | 0.944 | 0.944 | 0.939 |
| Harmonic Levels | | | | | | |
| 3rd | 2.1% | 2.2% | 1.1% | 0.9% | 0.5% | 0.4% |
| 5th | 0.4% | 0.3% | 0.1% | 0.2% | 0.2% | 0.1% |
| 7th | 30.0% | 27.0% | 22.0% | 18.0% | 14.0% | 12.0% |
| 9th | 13.0% | 10.0% | 8.1% | 6.9% | 5.4% | 4.9% |
| 11th | 4.5% | 4.0% | 3.3% | 2.7% | 1.9% | 1.7% |

Again, it is important to note how the power factor changes as the series inductance increases. This is just the opposite of the performance of the network absent the "resonator". To illustrate the this point, the performance computations were repeated for the network absent the "reflector". (Again, no damping network was employed.) (Also, again, a constant, 100 watt load was employed.) With the constant, 100 watt load and with a total series inductance of 0.1947 henrys, the DC output voltage collapsed.

| Component Values | #1 | #2 | #3 | #4 | #5 | #6 |
|---|---|---|---|---|---|---|
| "Reflector" (540-544-546) | | | | | | |
| Resonant Frequency | 7th | 7th | 7th | 7th | 7th | 7th |
| (540) in H. | .0248 | .0306 | .0382 | .0458 | .0573 | .0649 |
| (546) in Mfd | 5.790 | 4.700 | 3.760 | 3.140 | 2.510 | 2.210 |
| (544) in Ohms | 330 | 330 | 330 | 330 | 330 | 330 |
| "Reflector" (550-552) | | | | | | |
| Resonant Frequency | 5th | 5th | 5th | 5th | 5th | 5th |
| (550) in H. | .0248 | .0306 | .0382 | .0458 | .0573 | .0649 |
| (552) in Mfd | 11.30 | 9.210 | 7.370 | 6.140 | 4.910 | 4.340 |
| "Reflector" (650-652) | | | | | | |
| Resonant Frequency | 3rd | 3rd | 3rd | 3rd | 3rd | 3rd |
| (650) in H. | .0248 | .0360 | .0382 | .0458 | .0573 | .0649 |
| (652) in Mfd | 31.50 | 25.50 | 20.50 | 17.10 | 13.60 | 12.00 |
| "Resonator" (670-672) | | | | | | |
| Resonant Frequency | * | * | * | * | * | * |
| (670) in H. | * | * | * | * | * | * |
| (672) in Mfd | * | * | * | * | * | * |
| Performance Characteristics | | | | | | |
| Total Series Inductance in Henrys | .0744 | .0918 | .1146 | .1374 | .1719 | .1947 |
| Average DC Output Voltage in Volts | 131.0 | 129.0 | 126.0 | 121.0 | 101.0 | * |
| Power Factor | 0.878 | 0.905 | 0.890 | 0.871 | 0.738 | * |
| Harmonic Levels | | | | | | |
| 3rd | 2.5% | 1.6% | 1.0% | 0.7% | 0.3 | * |
| 5th | 0.4% | 0.3% | 0.3% | 0.1% | 0.1% | * |
| 7th | 32.0% | 28.0% | 22.0% | 17.0% | 11.0% | * |
| 9th | 9.6% | 7.2% | 6.0% | 5.5% | 4.4% | * |
| 11th | 4.4% | 3.0% | 1.7% | 1.4% | 1.8% | * |

To illustrate the performance of the harmonic currents isolating network shown in FIG. 4 as a function of the resonant frequency of the "resonator", computations were performed on variations of the network in which the resonant frequency of the "resonators" was changed. In all computations, a "resonator" impedance of 330 Ohms was employed. (No damping network was employed.) (Also, again, a constant, 100 watt load was employed.) For "resonator" frequencies of 4.9 and 5.0, the DC output voltage collapsed.

| Component Values | #1 | #2 | #3 | #4 | #5 | #6 | #7 | #8 |
|---|---|---|---|---|---|---|---|---|
| "Reflector" (540-544-546) | | | | | | | | |
| Reson. Freq. | 7th | 7th | 7th | 7th | 7th | 7th | 7th | 7th |
| (540) in H. | .0649 | .0649 | .0649 | .0649 | .0649 | .0649 | .0649 | .0649 |
| (546) in Mfd | 2.210 | 2.210 | 2.210 | 2.210 | 2.210 | 2.210 | 2.210 | 2.210 |
| (544) in Ohms | 330 | 330 | 330 | 330 | 330 | 330 | 330 | 330 |
| "Reflector" (550-552) | | | | | | | | |
| Reson. Freq. | 5th | 5th | 5th | 5th | 5th | 5th | 5th | 5th |
| (550) in H. | .0649 | .0649 | .0649 | .0649 | .0649 | .0649 | .0649 | .0649 |
| (552) in Mfd | 4.340 | 4.340 | 4.340 | 4.340 | 4.340 | 4.340 | 4.340 | 4.340 |
| "Reflector" (650-652) | | | | | | | | |
| Reson. Freq. | 3rd | 3rd | 3rd | 3rd | 3rd | 3rd | 3rd | 3rd |
| (650) in H. | .0649 | .0649 | .0649 | .0649 | .0649 | .0649 | .0649 | .0649 |
| (652) in Mfd | 12.00 | 12.00 | 12.00 | 12.00 | 12.00 | 12.00 | 12.00 | 12.00 |
| "Resonator" (670-672) | | | | | | | | |
| Reson. Freq. | | 4.9 | 5.0 | 5.3 | 5.4 | 5.5 | 5.75 | 5.95 | 6.05 |
| (670) in H. | | .1786 | .1751 | .1652 | .1621 | .1590 | .1522 | .1471 | .1447 |

-continued

| Component Values | #1 | #2 | #3 | #4 | #5 | #6 | #7 | #8 |
|---|---|---|---|---|---|---|---|---|
| (672) in Mfd | 1.640 | 1.608 | 1.517 | 1.401 | 1.460 | 1.390 | 1.351 | 1.321 |
| For a "Resonator" Impedance of 330 Ohms | | | | | | | | |
| Performance Characteristics | | | | | | | | |
| "Resonator" Frequency (Times Line F.) | 4.90 | 5.00 | 5.30 | 5.40 | 5.50 | 5.75 | 5.95 | 6.05 |
| Average DC Output Voltage in Volts | * | * | 135.5 | 138.5 | 141.5 | 130.5 | 118.5 | 111.5 |
| Power Factor | * | * | 0.913 | 0.930 | 0.939 | 0.909 | 0.854 | 0.807 |
| Harmonic Levels | | | | | | | | |
| 3rd | * | * | 0.3% | 0.4% | 0.4% | 0.4% | 0.3% | 0.2% |
| 5th | * | * | 0.1% | 0.1% | 0.1% | 0.1% | 0.1% | 0.1% |
| 7th | * | * | 11.0% | 12.0% | 12.0% | 12.0% | 11.0% | 10.0% |
| 9th | * | * | 5.3% | 5.1% | 4.9% | 4.6% | 4.3% | 4.0% |
| 11th | * | * | 1.7% | 1.6% | 1.7% | 1.7% | 1.7% | 1.8% |

To illustrate how "apportioning" the series inductance among the three "reflectors" affects the distribution of harmonic energy for the harmonic currents isolating network shown in FIG. 4, additional computations were performed.

| Component Values | #1 | #2 | #3 | #4 | #5 | #6 |
|---|---|---|---|---|---|---|
| "Reflector" (540-544-546) | | | | | | |
| Resonant Frequency | 7th | 7th | 7th | 7th | 7th | 7th |
| (540) in H. | .0153 | .0230 | .0306 | .0460 | .0458 | .0688 |
| (546) in Mfd | 9.390 | 6.270 | 4.700 | 3.135 | 3.140 | 2.090 |
| (544) in Ohms | 240 | 240 | 240 | 240 | 240 | 240 |
| "Reflector" (550-552) | | | | | | |
| Resonant Frequency | 5th | 5th | 5th | 5th | 5th | 5th |
| (550) in H. | .0153 | .00573 | .0306 | .0115 | .0458 | .0172 |
| (552) in Mfd | 18.40 | 49.10 | 9.210 | 24.55 | 6.140 | 16.40 |
| "Reflector" (650-652) | | | | | | |
| Resonant Frequency | 3rd | 3rd | 3rd | 3rd | 3rd | 3rd |
| (650) in H. | .0153 | .0172 | .0306 | .0344 | .0458 | .0516 |
| (652) in Mfd | 51.10 | 45.50 | 25.50 | 22.75 | 17.10 | 15.20 |
| "Resonator" (670-672) | | | | | | |
| Resonant Frequency | 5.5 | 5.5 | 5.5 | 5.5 | 5.5 | 5.5 |
| (670) in H. | .1160 | .1160 | .1160 | .1160 | .1160 | .1160 |
| (672) in Mfd | 2.010 | 2.010 | 2.010 | 2.010 | 2.010 | 2.010 |
| For a "Resonator" Impedance of 240 Ohms at 5.5 Times the AC Power Line Frequency | | | | | | |
| Performance Characteristics | | | | | | |
| Average DC Output Voltage in Volts | 137.5 | 137.5 | 142.5 | 143.5 | 145.0 | 145.0 |
| Power Factor | 0.882 | 0.890 | 0.913 | 0.935 | 0.953 | 0.962 |
| Harmonic Levels | | | | | | |
| 3rd | 5.5% | 5.2% | 1.5% | 1.4% | 0.6% | 0.6% |
| 5th | 0.5% | 7.5% | 0.1% | 2.2% | 0.1% | 1.0% |
| 7th | 35.0% | 22.0% | 22.0% | 13.0% | 15.0% | 8.5% |
| 9th | 18.0% | 3.1% | 9.0% | 2.8% | 6.1% | 2.9% |
| 11th | 4.9% | 1.5% | 2.9% | 1.4% | 1.6% | 0.7% |

To illustrate the performance of the harmonic currents isolating network shown in FIG. 4 with the addition of the "damping" network, additional computations were performed. First, computations were performed with one level of series inductance; then, computations were performed with a higher level of series inductance. In each case, a slight reduction in the level of the higher order harmonics was achieved, however, at a considerable sacrifice in power factor. (Also, again, a constant, 100 watt load was employed.)

| Component Values | #1 | #2 | #3 | #4 |
|---|---|---|---|---|
| "Reflector" (540-544-546) | | | | |
| Resonant Frequency | 7th | 7th | 7th | 7th |
| (540) in H. | .0460 | .0460 | .0460 | .0460 |
| (546) in Mfd | 3.135 | 3.135 | 3.135 | 3.135 |
| (544) in Ohms | 240 | 240 | 240 | 240 |
| "Reflector" (550-552) | | | | |
| Resonant Frequency | 5th | 5th | 5th | 5th |
| (550) in H. | .0115 | .0115 | .0115 | .0115 |
| (552) in Mfd | 24.55 | 24.55 | 24.55 | 24.55 |
| "Reflector" (650-652) | | | | |
| Resonant Frequency | 3rd | 3rd | 3rd | 3rd |
| (650) in H. | .0344 | .0344 | .0344 | .0344 |
| (652) in Mfd | 22.75 | 22.75 | 22.75 | 22.75 |
| "Resonator" (670-672) | | | | |
| Resonant Frequency | 5.5 | 5.5 | 5.5 | 5.5 |
| (670) in H. | .1160 | .1160 | .1160 | .1160 |
| (672) in Mfd | 2.010 | 2.010 | 2.010 | 2.010 |
| For a "Resonator" Impedance of 240 Ohms at 5.5 Times the AC Power Line Frequency | | | | |
| Performance Characteristics | | | | |
| Damping Component Values | | | | |
| Resistance | none | 417 O | 341 O | 295 O |
| Capacitance | none | 1 mfd | 2 mfd | 4 mfd |
| Average DC Output Voltage in Volts | 144.0 | 146.5 | 147.5 | 149.0 |
| Power Factor | 0.935 | 0.930 | 0.905 | 0.841 |
| Harmonic Levels | | | | |
| 3rd | 1.4% | 1.3% | 1.3% | 1.1% |
| 5th | 2.2% | 1.8% | 1.7% | 1.4% |
| 7th | 13.0% | 12.0% | 10.0% | 8.9% |
| 9th | 2.8% | 2.8% | 2.6% | 2.2% |
| 11th | 1.4% | 1.0% | 0.9% | 0.8% |

| Component Values | #1 | #2 | #3 | #4 |
|---|---|---|---|---|
| "Reflector" (540-544-546) | | | | |
| Resonant Frequency | 7th | 7th | 7th | 7th |
| (540) in H. | .0688 | .0688 | .0688 | .0688 |
| (546) in Mfd | 2.090 | 2.090 | 2.090 | 2.090 |
| (544) in Ohms | 240 | 240 | 240 | 240 |
| "Reflector" (550-552) | | | | |
| Resonant Frequency | 5th | 5th | 5th | 5th |
| (550) in H. | .0172 | .0172 | .0172 | .0172 |
| (552) in Mfd | 16.40 | 16.40 | 16.40 | 16.40 |
| "Reflector" (650-652) | | | | |
| Resonant Frequency | 3rd | 3rd | 3rd | 3rd |
| (650) in H. | .0516 | .0516 | .0516 | .0516 |

-continued

| Component Values | #1 | #2 | #3 | #4 |
|---|---|---|---|---|
| (652) in Mfd | 15.20 | 15.20 | 15.20 | 15.20 |
| "Resonator" (670-672) | | | | |
| Resonant Frequency | 5.5 | 5.5 | 5.5 | 5.5 |
| (670) in H. | .1160 | .1160 | .1160 | .1160 |
| (672) in Mfd | 2.010 | 2.010 | 2.010 | 2.010 |
| For a "Resonator" Impedance of 240 Ohms at 5.5 Times the AC Power Line Frequency | | | | |
| Performance Characteristics | | | | |
| Damping Component Values | | | | |
| Resistance | none | 417 O | 417 O | 341 O |
| Capacitance | none | 1 mfd | 1 mfd | 2 mfd |
| Average DC Output Voltage in Volts | 145.0 | 148.0 | 148.0 | 150.0 |
| Power Factor | 0.962 | 0.935 | 0.935 | 0.922 |
| Harmonic Levels | | | | |
| 3rd | 0.6% | 0.6% | 0.6% | 0.5% |
| 5th | 1.0% | 0.7% | 0.8% | 0.7% |
| 7th | 8.5% | 7.5% | 7.3% | 6.5% |
| 9th | 2.8% | 2.8% | 2.8% | 2.5% |
| 11th | 0.7% | 0.3% | 0.3% | 0.2% |

The "resonator" impedance also influences the harmonic levels when the "damping" network is added to the harmonic currents isolating network shown in FIG. 4, as illustrated by the additional computations. Also, "resonator" impedances of 165 and 240 ohms, as indicated. (Also, again, a constant, 100 watt load was employed.)

| Component Values | #1 | #2 | #3 |
|---|---|---|---|
| "Reflector" (540-544-546) | | | |
| Resonant Frequency | 7th | 7th | 7th |
| (540) in H. | .0688 | .0688 | .0688 |
| (546) in Mfd | 2.090 | 2.090 | 2.090 |
| (544) in Ohms | 165 | 165. | 240 |
| "Reflector" (550-552) | | | |
| Resonant Frequency | 5th | 5th | 5th |
| (550) in H. | .0172 | .0172 | .0172 |
| (552) in Mfd | 16.40 | 16.40 | 16.40 |
| "Reflector" (650-652) | | | |
| Resonant Frequency | 3rd | 3rd | 3rd |
| (650) in H. | .0516 | .0516 | .0516 |
| (652) in Mfd | 15.20 | 15.20 | 15.20 |
| "Resonator" (670-672) | | | |
| Resonant Frequency | 5.5 | 5.5 | 5.5 |
| (670) in H. | .0795 | .0795 | .1160 |
| (672) in Mfd | 2.920 | 2.920 | 2.010 |
| "Resonator" Impedance at 5.5 Times the AC Power Line Frequency in Ohms | 165 | 165 | 240 |
| Performance Characteristics | | | |
| Damping Component Values | | | |
| Resistance | none | 230 | none |
| Capacitance | none | 3.08 | none |
| Average DC Output Voltage in Volts | 146.0 | 156.0 | 145.0 |
| Power Factor | 0.957 | 0.901 | 0.962 |
| Harmonic Levels | | | |
| 3rd | 0.4% | 0.4% | 0.6% |
| 5th | 0.8% | 0.5% | 1.0% |
| 7th | 5.9% | 4.6% | 8.5% |
| 9th | 2.7% | 2.0% | 2.8% |
| 11th | 1.1% | 0.4% | 0.7% |

Turning now to FIG. 5, a number of computer generated waveforms are illustrated which are associated with the three "reflector" harmonic currents isolating network shown in FIG. 4. For generating the waveforms, the following component values were employed:

| Component Values | |
|---|---|
| "Reflector" (540-544-546) | |
| Resonant Frequency | 7th |
| (540) in H. | .0688 |
| (546) in Mfd | 2.090 |
| (544) in Ohms | 240 |
| "Reflector" (550-552) | |
| Resonant Frequency | 5th |
| (550) in H. | .0172 |
| (552) in Mfd | 16.40 |
| "Reflector" (650-652) | |
| Resonant Frequency | 3rd |
| (650) in H. | .0516 |
| (652) in Mfd | 15.20 |
| "Resonator" (670-672) | |
| Resonant Frequency | 5.5 |
| (670) in H. | .1160 |
| (672) in Mfd | 2.010 |
| For a "Resonator" Impedance of 240 Ohms at 5.5 Times the AC Power Line Frequency | |
| Damping Component Values | none |

Specifically, at the top of the figure, generally designated by the number 710, is the (sinusoidal) waveform associated with the AC power line potential developed on AC power line 512. Below AC power line potential waveform 710, generally designated 720, is the near trapezoidal (squarewave) waveform of the potential developed across the input (522-522') of the bridge rectifier (680) of the DC power supply (514). Next, below the waveform (720) of the potential developed across the input (522-522') of the bridge rectifier (680) of the DC power supply (514) is the waveform, designated 730, of the current therethrough. It is important to note the sinusoidal component of the waveform at the "resonator" frequency. Finally, below the waveform (730) of the current through the input (522-522') of the DC power supply (514) is the waveform, designated 740, of the current through the "resonator" (inductor 670 and capacitor 672). Again, it is important to note the sinusoidal component of the waveform at the "resonator" frequency.

It is important to note that in each of the above embodiments of the present invention, since the components employed are all passive, they may be scaled up or down. First, the ratio of the desired power rating to the given power rating is obtained. Then, the inductance of each of the inductors is divided by the ratio; the capacitance of each of the capacitors is multiplied by the ratio; and, the resistance of each of the resistors is divided by the ratio.

It is contemplated that after having read the preceding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. A harmonic noise isolation and power factor correction network that has an input to output impedance magnitude, in ohms, that is at least ten percent of an input voltage, in volts, divided by a resulting current through the network, in amperes, at a predetermined power line frequency, the network comprising:
   a pair of first and second power input terminals for receiving a single phase alternating current (AC)

power input of said predefined power line frequency;

a pair of first and second power output terminals for driving a capacitor-input rectifier combination that generates odd harmonics of said predefined power line frequency and that has a constant conduction angle, said second output terminal being in common with said second input terminal;

a first two-terminal parallel resonant circuit including a first parallel inductor in parallel with a first parallel capacitor, and having a first resonant frequency, the first parallel resonant circuit being connected in series between said first power input terminal and said first power output terminal, the first two-terminal parallel resonant circuit having a resonant frequency approximately equal to five times said predefined power line frequency; and one and only one two-terminal series resonant circuit including a first series inductor connected in series with a first series capacitor, the first series resonant circuit being connected in shunt with said first and second output terminals, the series resonant circuit having a resonant frequency approximately equal to an odd harmonic plus one half times said predefined power line frequency.

2. The network of claim 1, further comprising:

a second two-terminal parallel resonant circuit including a second parallel inductor in parallel with a second parallel capacitor and a resistor in series, the second parallel resonant circuit being connected in series with the first parallel resonant circuit and in series between said first power input terminal and said first power output terminal, the second two-terminal parallel resonant circuit having a resonant frequency approximately equal to seven times said predetermined power line frequency.

3. The network of claim 2, further comprising a third two-terminal parallel resonant circuit including a third parallel inductor and a third parallel capacitor, the third parallel resonant circuit being connected in series with both the first and second parallel resonant circuits and all the parallel resonant circuits connected in series with one another between said first power input terminal and said first power output terminal, the third two-terminal parallel resonant circuit having a resonant frequency approximately equal to three times said predefined power line frequency.

4. The network of claim 1, further comprising:

an AC-to-direct-current (DC) power conversion means with a power load and that is coupled to said first and second power output terminals and that does not vary its rectification conduction angles such that a spurious noise with an unvarying harmonic content is presented to said first and second power output terminals during operation wherein such spurious noise is thereby substantially blocked from backing through to said first and second power input terminals by the parallel and series resonant circuits and their harmonic combination topology.

5. The network of claim 4, wherein:

the AC-to-DC power conversion means further includes a full-wave rectifier that generates said spurious noise at predictable odd harmonics of said predefined power line frequency.

6. The network of claim 1, wherein:

the two-terminal series resonant circuit has a resonant frequency that is substantially five and one-half times said predefined power line frequency.

7. The network of claim 1, wherein:

the two-terminal series resonant circuit has a circuit-Q that is within a range of 0.5 to 3.0.

8. The network of claim 3, wherein:

the first through third two-terminal parallel resonant circuits present an impedance with a magnitude, in ohms, that is at least ten percent of a voltage applied across said first and second power input terminals, in volts, divided by a resulting current through the first two-terminal parallel resonant circuit, in amperes, at said predetermined power line frequency.

9. The network of claim 1, further comprising:

a damping circuit including a damping resistor connected in series with a damping capacitor, the damping circuit being connected in parallel with the series resonant circuit and with said first and second output terminals.

10. The network of claim 1, wherein:

the two-terminal series resonant circuit has an impedance substantially within a range of 240 ohms to 330 ohms at said resonant frequency.

11. The network of claim 3, wherein:

the two-terminal series resonant circuit has an impedance substantially within a range of 240 ohms to 330 ohms at said resonant frequency; and said resistor included in the second two-terminal parallel resonant circuit is substantially equal in resistance to said impedance of two-terminal series resonant circuit.

12. A harmonic noise isolation and power factor correction network, comprising:

a pair of first and second power input terminals for receiving a single phase alternating current (AC) power input of a predefined power line frequency;

a pair of first and second power output terminals, said second output terminal being in common with said second input terminal;

a first two-terminal parallel resonant circuit including a first parallel inductor in parallel with a first parallel capacitor, and having a first resonant frequency, the first parallel resonant circuit being connected in series between said first power input terminal and said first power output terminal;

a second two-terminal parallel resonant circuit including a second parallel inductor in parallel with a second parallel capacitor and a resistor in series, and having a second resonant frequency, the second parallel resonant circuit being connected in series with the first parallel resonant circuit;

a third two-terminal parallel resonant circuit including a third parallel inductor and a third parallel capacitor and having a third resonant frequency, the third parallel resonant circuit being connected in series with both the first and second parallel resonant circuits and all the parallel resonant circuits being connected in series with one another between said first power input terminal and said first power output terminal;

a two-terminal series resonant circuit including a first series inductor connected in series with a first series capacitor, the first series resonant circuit being connected in shunt with said first and second output terminals and having a resonant frequency approximately five and one-half times said predetermined power line frequency; and a damping circuit including a damping resistor connected in series with a damping capacitor, the damping circuit being connected in parallel with the series resonant circuit and with said first and second output terminals.

13. The network of claim 12, wherein said first resonant frequency is approximately five times said predetermined power line frequency;

said second resonant frequency is approximately seven times said predefined power line frequency; and said third resonant frequency is approximately three times said predefined power line frequency.

* * * * *